United States Patent
Torimoto et al.

(10) Patent No.: US 12,389,724 B2
(45) Date of Patent: Aug. 12, 2025

(54) METHOD FOR PRODUCING SEMICONDUCTOR NANOPARTICLES AND LIGHT-EMITTING DEVICE

(71) Applicants: National University Corporation Tokai National Higher Education and Research System, Nagoya (JP);
OSAKA UNIVERSITY, Suita (JP);
NICHIA CORPORATION, Anan (JP)

(72) Inventors: Tsukasa Torimoto, Nagoya (JP);
Tatsuya Kameyama, Nagoya (JP);
Chie Miyamae, Nagoya (JP); Susumu Kuwabata, Ibaraki (JP); Taro Uematsu, Suita (JP); Tomoya Kubo, Tokushima (JP)

(73) Assignees: National University Corporation Tokai National Higher Education and Research System, Nagoya (JP);
OSAKA UNIVERSITY, Suita (JP);
NICHIA CORPORATION, Anan (JP)

( * ) Notice: Subject to any disclaimer, the term of this patent is extended or adjusted under 35 U.S.C. 154(b) by 686 days.

(21) Appl. No.: 17/653,868

(22) Filed: Mar. 7, 2022

(65) Prior Publication Data

US 2022/0285589 A1 Sep. 8, 2022

(30) Foreign Application Priority Data

Mar. 8, 2021 (JP) .................................. 2021-036602
Aug. 24, 2021 (JP) .................................. 2021-136452

(51) Int. Cl.
*H10H 20/851* (2025.01)
*B82Y 20/00* (2011.01)
(Continued)

(52) U.S. Cl.
CPC .......... *H10H 20/8512* (2025.01); *B82Y 20/00* (2013.01); *B82Y 40/00* (2013.01); *H10H 20/0361* (2025.01)

(58) Field of Classification Search
CPC .......... H10H 20/8512; H10H 20/0361; H10H 29/41; B82Y 20/00; B82Y 40/00; H10D 62/177
See application file for complete search history.

(56) References Cited

U.S. PATENT DOCUMENTS 11,624,027 B2 * 4/2023 Kim .................. C09K 11/62
252/301.6 S
2010/0193806 A1 8/2010 Byun
(Continued)

FOREIGN PATENT DOCUMENTS

EP 3922604 A1 12/2021
JP 2010177656 A 8/2010
(Continued)

*Primary Examiner* — Julia Slutsker
(74) *Attorney, Agent, or Firm* — Hunton Andrews Kurth LLP

(57) ABSTRACT

Provided is a method for producing semiconductor nanoparticles. The method includes: providing first semiconductor nanoparticles containing a semiconductor containing an element M1, an element M2 and an element Z, wherein the element M1 is at least one element selected from the group consisting of Ag, Cu, Au and an alkali metal, and contains at least Ag, the element M2 is at least one element selected from the group consisting of Al, Ga, In and Tl, and contains at least one of In and Ga, and the element Z contains at least one element selected from the group consisting of S, Se and Te; and heat-treating a mixture containing the first semiconductor nanoparticles, a first compound having a Ga—S bond, a second compound containing Ga and not containing S, and an organic solvent to obtain second semiconductor nanoparticles.

6 Claims, 5 Drawing Sheets

(51) Int. Cl.
*B82Y 40/00* (2011.01)
*H10H 20/01* (2025.01)

(56) References Cited

U.S. PATENT DOCUMENTS

| | | |
|---|---|---|
| 2015/0162468 A1 | 6/2015 | Newman |
| 2020/0006601 A1 | 1/2020 | Torimoto et al. |
| 2021/0083146 A1 | 3/2021 | Kuwabata et al. |
| 2021/0363422 A1* | 11/2021 | Nikata ................. C09K 11/883 |

FOREIGN PATENT DOCUMENTS

| | | |
|---|---|---|
| JP | 2012212862 A | 11/2012 |
| JP | 2017501571 A | 1/2017 |
| JP | 2018044142 A | 3/2018 |
| JP | 2018141141 A | 9/2018 |
| JP | 2020033245 A | 3/2020 |
| JP | 2020152904 A | 9/2020 |
| WO | 2019160094 A1 | 8/2019 |
| WO | 2020162622 A1 | 8/2020 |
| WO | 2021039290 A1 | 3/2021 |
| WO | 2021039727 A1 | 3/2021 |

* cited by examiner

METHOD FOR PRODUCING SEMICONDUCTOR NANOPARTICLES AND LIGHT-EMITTING DEVICE

CROSS-REFERENCE TO RELATED APPLICATIONS

This application also claims priority to Japanese Patent Application No. 2021-036602, filed on Mar. 8, 2021 and Japanese Patent Application No. 2021-136452 filed on Aug. 24, 2021, the contents of which are incorporated by reference herein in their entireties.

BACKGROUND

The present disclosure relates to a method for producing semiconductor nanoparticles and a light-emitting device.

Semiconductor particles are known to exhibit quantum size effect when the particle size thereof is, for example, 10 nm or less. Such nanoparticles are called quantum dots (also referred to as semiconductor quantum dots). The quantum size effect refers to a phenomenon in which each of a valence band and a conduction band, which are considered to be continuous in a bulk particle, becomes discrete when the particle size is a nanosize, and band gap energy changes according to the particle size.

Since the quantum dot is able to absorb light and convert the wavelength of light into light corresponding to its band gap energy, a white light-emitting device utilizing light emission of the quantum dot has been proposed (see, for example, Japanese Patent Laid-open Publication No. 2012-212862 and Japanese Patent Laid-open Publication No. 2010-177656). In addition, semiconductor nanoparticles that enables band edge emission and may have a low toxicity composition, and a method for producing the semiconductor nanoparticles have been proposed, see, for example, Japanese Patent Laid-open Publication No. 2018-044142.

SUMMARY

A first aspect of the present disclosure is a method for producing semiconductor nanoparticles, comprising: providing first semiconductor nanoparticles (hereinafter, also referred to as "core"); and heat-treating a mixture containing the first semiconductor nanoparticles, a first compound having a Ga—S bond, a second compound containing Ga and not containing S, and an organic solvent to obtain second semiconductor nanoparticles (hereinafter, also referred to as "core-shell type semiconductor nanoparticles"). The first semiconductor nanoparticles contain a semiconductor containing an element $M^1$, an element $M^2$ and an element Z. The element $M^1$ is at least one element selected from the group consisting of Ag, Cu, Au and an alkali metal, and contains at least Ag. The element $M^2$ is at least one element selected from the group consisting of Al, Ga, In and Tl, and contains at least one of In and Ga. The element Z contains at least one element selected from the group consisting of S, Se and Te.

A second aspect of the present disclosure is a light-emitting device comprising: a light conversion member containing the second semiconductor nanoparticles obtained by the method for producing the semiconductor nanoparticles; and a semiconductor light-emitting element.

DETAILED DESCRIPTION

Figure 1:
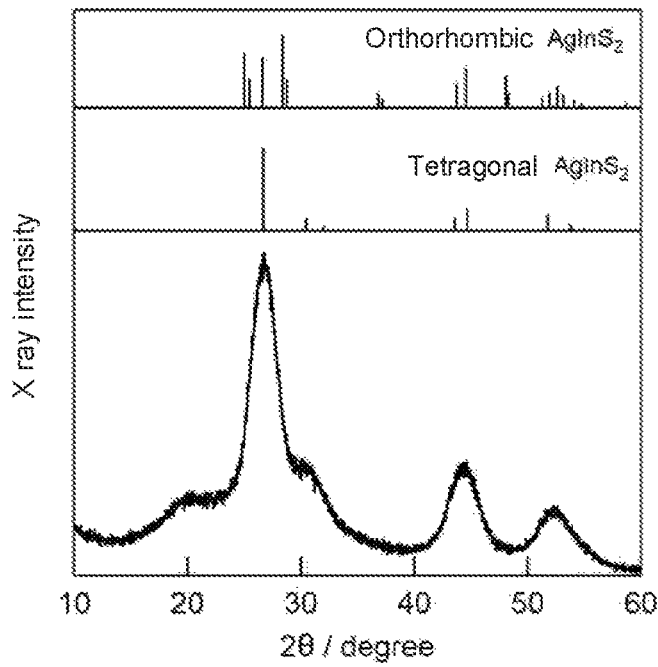
FIG. 1 is an exemplary X-ray diffraction pattern of first semiconductor nanoparticles.

In the present specification, the term "step" includes not only an independent step but also a step that cannot be clearly distinguished from other steps as long as the intended purpose of the step is achieved. In addition, when a plurality of substances corresponding to each component are present in the composition, the content of each component in the composition means the total amount of the plurality of substances present in the composition unless otherwise specified. Furthermore, the upper limit and the lower limit of the numerical range described in the present specification may be optionally selected and combined. In the present specification, the relationship between the wavelength range of light and the color name of monochromatic light conform to JIS Z 8110. The half-width in the emission spectrum is the wavelength width of the emission spectrum at which emission intensity is 50% with respect to the maximum emission intensity (full width at half maximum; FWHM). Hereinafter, embodiments of the present invention will be described in detail. However, the following embodiments exemplify a method for producing semiconductor nanoparticles for embodying the technical idea of the present invention, and the present invention is not limited to the following method for producing semiconductor nanoparticles.

Method for Producing Semiconductor Nanoparticles

A method for producing semiconductor nanoparticles comprises: a first step of providing first semiconductor nanoparticles; and a second step of heat-treating a mixture containing the first semiconductor nanoparticles, a first compound having a Ga—S bond, a second compound containing Ga and not containing S, and an organic solvent to obtain second semiconductor nanoparticles. The first semiconductor nanoparticles (core) contain a first semiconductor containing an element $M^1$, an element $M^2$ and an element Z. The element $M^1$ is at least one element selected from the group consisting of silver (Ag), copper (Cu), gold (Au) and an alkali metal, and contains at least Ag. The element $M^2$ is at least one element selected from the group consisting of aluminum (Al), Ga, indium (In) and thallium (Tl), and contains at least one of In and Ga. The element Z has a composition containing at least one element selected from the group consisting of S, selenium (Se) and tellurium (Te). According to one aspect of the present disclosure, it is possible to provide a method for producing semiconductor nanoparticles that enables band edge emission and has good luminous efficiency.

In this production method, for example, the provided mixture containing the first semiconductor nanoparticles, the first compound having a gallium (Ga)-sulfur (S) bond, the second compound containing Ga and not containing S, and the organic solvent is heat-treated, whereby semiconductor nanoparticles is able to be obtained as second semiconductor nanoparticles in which an attached substance (hereinafter, also referred to as "shell") substantially not containing the element $M^1$ and containing gallium and sulfur is disposed in the vicinity of the surface of the first semiconductor nanoparticles, or second semiconductor nanoparticles in which a semiconductor layer (hereinafter, also referred to as "shell") substantially not containing the element $M^1$ and containing gallium and sulfur is disposed in a portion inside the first semiconductor nanoparticles and near the surface. The attached substance disposed on the surface of the first semiconductor nanoparticles may cover the first semiconductor nanoparticles. In addition, the obtained semiconductor nanoparticles may be, for example, core-shell type semiconductor nanoparticles. Here, the term "substantially not containing" means that the proportion of the element $M^1$ to elements other than the element $M^1$ is, for example, 10% by mol or less, preferably 5% by mol or less, and more preferably 1% by mol or less.

In the method for producing semiconductor nanoparticles, for example, when an attached substance is disposed on the surface of the first semiconductor nanoparticles, the first compound having a Ga—S bond and the second compound containing Ga and not containing S are used as a material for forming an attached substance, thereby making it possible to generate semiconductor nanoparticles having good luminous efficiency. This is seemingly partly because, for example, the first compound having a Ga—S bond allows efficient generation of a semiconductor to be an attached substance in the vicinity of the surface of the first semiconductor nanoparticles, and combined use with the second compound allows sufficient supply of Ga, which is insufficient only with the first compound.

First Step

In the first step, the first semiconductor nanoparticles containing a semiconductor containing an element $M^1$, an element $M^2$ and an element Z is provided. The first semiconductor nanoparticles may be appropriately selected from commercially available semiconductor nanoparticles and provided, or semiconductor nanoparticles having a desired composition may be produced and provided.

The element $M^1$ constituting the first semiconductor nanoparticles contains Ag, and may further contain at least one element selected from the group consisting of Cu, Au and an alkali metal. The alkali metal in the element $M^1$ includes lithium (Li), sodium (Na), potassium (K), rubidium (Rb) and cesium (Cs). Since the alkali metal can be a monovalent cation like Ag, a part of Ag in the composition of the semiconductor nanoparticles may be substituted. In particular, Li has approximately the same ionic radius as Ag, and is preferably used. In the composition of the semiconductor nanoparticles, for example, when a part of Ag is substituted with an alkali metal, for example, a band gap is widened and an emission peak wavelength is shifted to a short wavelength side. The element $M^2$ contains at least one of In and Ga, and may further contain at least one element selected from the group consisting of Al and Tl. The element Z contains at least one element selected from the group consisting of S, Se and Te, and may contain at least S.

The total content of the element $M^1$ in the composition of the first semiconductor nanoparticles may be, for example, 10% by mol or more and 30% by mol or less, and is preferably 15% by mol or more and 25% by mol or less. The total content of the element $M^2$ in the composition of the first semiconductor nanoparticles is, for example, 15% by mol or more and 35% by mol or less, and preferably 20% by mol or more and 30% by mol or less. The total content of the element Z in the composition of the first semiconductor nanoparticles is, for example, 35% by mol or more and 55% by mol or less, and preferably 40% by mol or more and 55% by mol or less.

When the first semiconductor nanoparticles contain In and Ga as the element $M^2$, the ratio of the number of atoms of In to the sum of the numbers of atoms of In and Ga in the composition (In/(In+Ga)) is, for example, 0.01 or more and less than 1.0, and preferably 0.1 or more and 0.99 or less. In addition, the ratio ($M^1/M^2$) of the total number of atoms of the element $M^1$ (for example, Ag) to the total number of atoms of the element $M^2$ (for example, In and Ga) in the composition of the first semiconductor nanoparticles is, for example, 0.3 or more and 1.2 or less, and preferably 0.5 or more and 1.1 or less. The ratio ($Z/(M^1+M^2)$) of the total number of atoms of the element Z (for example, S) to the total number of atoms of the element $M^1$ (for example, Ag) and the element $M^2$ (for example, In and Ga) in the composition of the first semiconductor nanoparticles is, for example, 0.8 or more and 1.5 or less, and preferably 0.9 or more and 1.2 or less.

The composition of the first semiconductor nanoparticles is identified by, for example, energy dispersive X-ray spectroscopy (EDX), fluorescent X-ray spectroscopy (XRF) or inductively coupled plasma (ICP) emission spectroscopy. The compositional ratio of Ag/(In+Ga) or S/(Ag+In+Ga) is calculated based on the composition identified by any of these methods.

In the composition of the first semiconductor nanoparticles, the element $M^1$ may contain at least one element of Cu and Au in addition to Ag, and may preferably substantially consist of Ag. Here, the term "substantially" means that the proportion of elements other than Ag to Ag is, for example, 10% by mol or less, preferably 5% by mol or less, and more preferably 1% by mol or less.

When the composition of the first semiconductor nanoparticles contain an alkali metal as the element $M^1$, the content of the alkali metal in the composition of the first semiconductor nanoparticles is, for example, less than 30% by mol, and preferably 1% by mol or more and 25% by mol or less. In addition, the ratio ($M^a/(Ag+M^a)$) of the number of atoms of the alkali metal ($M^a$) to the total of the number of atoms of Ag and the number of atoms of the alkali metal ($M^a$) in the composition of the first semiconductor nanoparticles is, for example, less than 1, preferably 0.8 or less, more preferably 0.4 or less, and still more preferably 0.2 or less. The ratio is, for example, more than 0, preferably 0.05 or more, and more preferably 0.1 or more. The alkali metal preferably contains at least one of Li and Na, and is preferably substantially Li. Here, the term "substantially" means that the proportion of the alkali metal other than Li to Li is, for example, 10% by mol or less, preferably 5% by mol or less, and more preferably 1% by mol or less. The alkali metal may be substantially Na. Here, the term "substantially" means that the proportion of the alkali metal other than Na to Na is, for example, 10% by mol or less, preferably 5% by mol or less, and more preferably 1% by mol or less.

In the composition of the first semiconductor nanoparticles, the element $M^2$ may contain at least one element of Al and Tl in addition to at least one of In and Ga, and may substantially consist of at least one of In and Ga. Here, the term "substantially" means that the proportion of elements other than In or Ga to In and Ga is, for example, 10% by mol or less, preferably 5% by mol or less, and more preferably 1% by mol or less.

In the composition of the first semiconductor nanoparticles, the element Z may contain S. The element Z may contain at least one element of Se and Te in addition to S, and may substantially consist of S. Here, the term "substantially" means that the proportion of elements other than S to S is, for example, 10% by mol or less, preferably 5% by mol or less, and more preferably 1% by mol or less.

The first semiconductor nanoparticles may substantially consist of at least one of Ag, In and Ga, and S alone. Here, the term "substantially" is used in consideration of inevitably containing elements other than Ag, In, Ga and S due to contamination of impurities.

The crystal structure of the first semiconductor nanoparticles may include at least one selected from the group consisting of a tetragonal structure, a hexagonal structure and an orthorhombic structure. For example, semiconductor nanoparticles containing Ag, In and S and having a tetragonal, hexagonal or orthorhombic crystal structure are generally introduced in documents as those represented by a compositional formula of $AgInS_2$. The first semiconductor nanoparticles according to the present embodiment may be considered as, for example, one in which a part of In which is a group 13 element has been substituted with Ga which is also a group 13 element. The composition of the first semiconductor nanoparticles may be represented by, for example, Ag—In—Ga—S.

Incidentally, among semiconductor nanoparticles represented by a compositional formula such as Ag—In—Ga—S, semiconductor nanoparticles having a hexagonal crystal structure is a wurtzite type, and a semiconductor nanoparticles having a tetragonal crystal structure is a chalcopyrite type. The crystal structure is identified, for example, by measuring an XRD pattern obtained by X-ray diffraction (XRD) analysis. Specifically, an XRD pattern obtained from semiconductor nanoparticles is compared with a known XRD pattern on the assumption that the semiconductor nanoparticles are semiconductor nanoparticles represented by the compositional formula of $AgInS_2$ or an XRD pattern obtained by performing simulation from crystal structure parameters. When there is a pattern that matches the pattern of the semiconductor nanoparticles among the known pattern and the simulation pattern, the crystal structure of the semiconductor nanoparticles is considered to be the crystal structure of the known or simulation pattern that has been matched.

In the first semiconductor nanoparticles, the first semiconductor nanoparticles having different crystal structures may be partially mixed. In this case, in the XRD pattern, peaks derived from a plurality of crystal structures may be observed.

The first semiconductor nanoparticles may have, for example, an average particle size of 50 nm or less. The average particle size of the first semiconductor nanoparticles may be, for example, 20 nm or less, 10 nm or less or less than 10 nm. When the average particle size of the first semiconductor nanoparticles is 50 nm or less, quantum size effect tends to be easily obtained, and band edge emission tends to be easily obtained. The lower limit of the average particle size of the first semiconductor nanoparticles is, for example, 1 nm.

The particle size of the first semiconductor nanoparticles may be determined, for example, from a TEM image taken using a transmission electron microscope (TEM). Specifically, the length of the longest line segment among line segments that connect any two points on the outer periphery of and pass through the inside of a certain particle observed in a TEM image is defined as the particle size of the particle.

However, when the particle has a rod shape, the length of the minor axis is regarded as the particle size. Here, the rod-shaped particle refers to a particle having a minor axis and a major axis orthogonal to the minor axis in a TEM image, and having a ratio of the length of the major axis to the length of the minor axis of greater than 1.2. The rod-shaped particle is observed in a TEM image as, for example, a quadrangular shape including a rectangular shape, an elliptical shape or a polygonal shape. The shape of the cross section, which is a plane orthogonal to the major axis of the rod shape, may be, for example, a circle, an ellipse or a polygon. Specifically, for the rod-shaped particle, the length of the major axis refers to the length of the longest line segment among line segments that connect any two points on the outer periphery of the particle in the case of the elliptical shape, and refers to the length of the longest line segment among line segments that are parallel to the longest side among the sides defining the outer periphery and connect any two points on the outer periphery of the particle in the case of the rectangular or polygonal shape. The length of the minor axis refers to a length of a line segment that is orthogonal to the line segment defining the length of the major axis and has the longest length among line segments connecting any two points on the outer periphery.

The average particle size of the first semiconductor nanoparticles is determined by measuring the particle sizes of all measurable particles observed in a TEM image at a magnification of 50,000 or more and 150,000 or less, and calculating the arithmetic average of the particle sizes. Here, the measurable particle is able to be observed as a whole in a TEM image. Therefore, in the TEM image, a particle that is not included in part in an imaging range and is partially cut out from the entire particle is not measurable. When the number of measurable particles included in one TEM image is 100 or more, the average particle size thereof is determined using the TEM image. On the other hand, when the number of measurable particles included in one TEM image is less than 100, a TEM image is further acquired by changing the imaging location, and the particle sizes of 100 or more measurable particles included in two or more TEM images are measured to determine the average particle size.

The first semiconductor nanoparticles may enable band edge emission. The first semiconductor nanoparticles may emit light having an emission peak wavelength within a range of 500 nm or more and 650 nm or less by irradiation with light having a wavelength in a range of 200 nm or more and less than 500 nm. The half-width in the emission spectrum of the first semiconductor nanoparticles is 250 meV or less, preferably 200 meV or less, and more preferably 150 meV or less. The lower limit value of the half-width is, for example, 30 meV or more. The half-width of 250 meV or less means that the half-width is 73 nm or less when the emission peak wavelength is 600 nm, the half-width is 100 nm or less when the emission peak wavelength is 700 nm, and the half-width is 130 nm or less when the emission peak wavelength is 800 nm, and means that the semiconductor nanoparticles emit light through band edge emission.

The first semiconductor nanoparticles may provide another light emission, for example, defective light emission, together with the band edge emission. The defective light emission generally has a long emission lifetime, has a broad spectrum, and has a peak on a longer wavelength side than that of the band edge emission. When the both band edge emission and the defective light emission are obtained, the intensity of the band edge emission is preferably larger than the intensity of the defective light emission.

The emission peak wavelength of the band edge emission of the first semiconductor nanoparticles may be changed by changing at least one of the shape and the average particle size of the first semiconductor nanoparticles, particularly the average particle size. For example, when the average particle size of the first semiconductor nanoparticles is further reduced, the band gap energy is further increased due to quantum size effect, whereby the emission peak wavelength of the band edge emission may be shifted to the short wavelength side.

The emission peak wavelength of the band edge emission of the first semiconductor nanoparticles may also be changed by changing the composition of the first semiconductor nanoparticles. For example, by increasing the Ga ratio (Ga/(In+Ga)), which is the ratio of the number of atoms of Ga to the sum of the numbers of atoms of In and Ga in the composition, the emission peak wavelength of the band edge emission may be shifted to the short wavelength side. In addition, for example, by selecting Li as the alkali metal and increasing the $M^a$ ratio ($M^a$/(Ag+$M^a$)), which is the ratio of the number of atoms of the alkali metal ($M^a$) to the sum of the number of atoms of Ag and the alkali metal ($M^a$) in the composition, the emission peak wavelength of the band edge emission may be shifted to the short wavelength side. In addition, for example, by substituting a part of S in the composition with Se, and increasing the S ratio (S/(S+Se)), which is the ratio of the number of atoms of S to the sum of the numbers of atoms of S and Se, the emission peak wavelength of the band edge emission may be shifted to the short wavelength side.

The absorption spectrum of the first semiconductor nanoparticles may show an exciton peak. The exciton peak is a peak obtained by generation of excitons, and the expression of the exciton peak in the absorption spectrum means that the first semiconductor nanoparticle group is composed of particles having a small particle size distribution and few crystal defects, which are suitable for band edge emission. In addition, a steeper exciton peak means that the aggregate of the first semiconductor nanoparticles contains more particles having uniform particle sizes and few crystal defects. Therefore, when the exciton peak is steep, the half-width of light emission is narrow, and luminous efficiency is expected to be improved. In the absorption spectrum of the first semiconductor nanoparticles, the exciton peak is observed within a range of, for example, 350 nm or more and 900 nm or less.

The first semiconductor nanoparticles may emit light having an emission peak wavelength on the longer wavelength side than the exciton peak of the absorption spectrum, due to the Stokes shift. When the absorption spectrum of the first semiconductor nanoparticles shows the exciton peak, the energy difference between the exciton peak and the emission peak wavelength is, for example, 300 meV or less.

The first semiconductor nanoparticles may be, for example, semiconductor nanoparticles containing Ag as the element $M^1$, at least one of In and Ga as the element $M^2$ and S as the element Z. In addition, the first semiconductor nanoparticles may be, for example, semiconductor nanoparticles having a composition represented by the following formula (1).

$$M^1_q M^2 Z_{(q+3)/2} \tag{1}$$

Here, $0.2 < q \le 1.2$ is satisfied.

The first semiconductor nanoparticles may also be obtained by, for example, the methods described in Japanese Patent Publication No. 2018-141141, International Patent Publication No. 2019/160094 and International Patent Publication No. 2020/162622, but may be produced by the following production method. For example, the first production method may include a raw material provision step of obtaining a first raw material mixture containing a salt containing the element $M^1$, a salt containing the element $M^2$, a source of the element Z and an organic solvent, and a heat treatment step of heat-treating the first raw material mixture to obtain first semiconductor nanoparticles. In addition, the second production method may include a raw material provision step of obtaining a second raw material mixture containing a salt containing the element $M^1$, a salt containing the element $M^2$ and an organic solvent, a temperature increasing step of heating the second raw material mixture to a predetermined temperature, and an addition step of adding a source of the element Z to the second raw material mixture whose temperature has been increased to obtain first semiconductor nanoparticles.

In the first production method, a salt containing the element $M^1$, a salt containing the element $M^2$ and a source of the element Z may be charged into an organic solvent at a time to provide a first raw material mixture, and the first raw material mixture may be heat-treated to produce first semiconductor nanoparticles. According to this method, the first semiconductor nanoparticles is able to be synthesized with good reproducibility in one pot by a simple operation. In addition, the first semiconductor nanoparticles may be produced by a method in which an organic solvent is reacted with a salt containing the element $M^1$ to form a complex, then an organic solvent is reacted with a salt containing the element $M^2$ to form a complex, and these complexes are reacted with a source of the element Z to cause crystal growth of the obtained reaction product. In this case, the heat treatment may be performed in a stage of reacting the complexes with the source of the element Z.

Each of the salt containing the element $M^1$ and the salt containing the element $M^2$ may be either an organic acid salt or an inorganic acid salt. Specific examples of the inorganic acid salt include nitrate, sulfate, hydrochloride and sulfonate. Examples of the organic acid salt include formate, acetate, oxalic acid and an acetylacetonate salt. The salt containing the element $M^1$ and the salt containing the element $M^2$ are preferably at least one selected from the group consisting of these salts, and are more preferably organic acid salts such as acetate and an acetylacetonate salt because they have high solubility in an organic solvent and reaction progresses more uniformly.

The first raw material mixture may further contain an alkali metal salt. Examples of the alkali metal (hereinafter, may be referred to as $M^a$) include lithium (Li), sodium (Na), potassium (K), rubidium (Rb) and cesium (Cs). It is preferable to contain at least one of Li and Na in that the ionic radius thereof is close to Ag. Examples of the alkali metal salt include organic acid salts and inorganic acid salts. Specific examples of the inorganic acid salt include nitrate, sulfate, hydrochloride and sulfonate, and specific examples of the organic acid salt include acetate and an acetylacetonate salt. Among them, an organic acid salt is preferable from the viewpoint of high solubility in an organic solvent.

Examples of the source of S among the sources of the element Z include a sulfur simple substance and a sulfur-containing compound. Specific examples of the sulfur-containing compound include β-dithiones such as 2,4-pentanedithione; dithiols such as 1,2-bis(trifluoromethyl)ethylene-1,2-dithiol; dialkyldithiocarbamates such as diethyldithiocarbamate; thiourea and alkylthioureas having an alkyl group having from 1 to 18 carbon atoms, such as monoalkylthiourea, 1,3-dialkylthiourea, 1,1-dialkylthiourea, 1,1,3-trialkylthiourea and 1,1,3,3-tetraalkylthiourea.

Examples of the source of Se include a selenium simple substance; and a Se-containing compound such as selenourea, selenoacetamide and alkylselenol. Examples of the Te source include a tellurium simple substance, a Te-phosphine complex and alkyl tellurol.

Examples of the organic solvent include amines having a hydrocarbon group having from 4 to 20 carbon atoms, for example, alkylamines or alkenylamines having from 4 to 20 carbon atoms, thiols having a hydrocarbon group having from 4 to 20 carbon atoms, for example, alkylthiols or alkenylthiols having from 4 to 20 carbon atoms, phosphines having a hydrocarbon group having from 4 to 20 carbon atoms, and for example, alkylphosphines or alkenylphosphines having from 4 to 20 carbon atoms. The organic solvent preferably contains at least one selected from the group consisting of these substances. For example, the obtained semiconductor nanoparticles may finally be surface-modified with these organic solvents. The organic solvent may be used in combination of two or more, and for example, a mixed solvent obtained by combining at least one selected from thiols having a hydrocarbon group having from 4 to 20 carbon atoms and at least one selected from amines having a hydrocarbon group having from 4 to 20 carbon atoms may be used. These organic solvents may be mixed with another organic solvent to use. When the organic solvent contains thiol and amine described above, the content volume ratio of thiol to amine (thiol/amine) is, for example, more than 0 and 1 or less, and preferably 0.007 or more and 0.2 or less.

The first raw material mixture may contain at least one of salts containing the element $M^1$, at least one of salts containing the element $M^2$ and at least one of sources of the element Z without reacting with each other, or may contain them as a complex formed therefrom. In addition, the first raw material mixture may contain an $M^1$ complex formed from a salt containing the element $M^1$, an $M^2$ complex formed from a salt containing the element $M^2$ and a complex formed from a source of the element Z. The complex is formed, for example, by mixing a salt containing the element $M^1$, a salt containing the element $M^2$ and a source of the element Z in an appropriate organic solvent. An atmosphere for mixing may be an inert gas atmosphere, for example, an argon atmosphere or a nitrogen atmosphere. Providing an inert gas atmosphere allows reduction or prevention of by-products of oxides. Here, the content of the inert gas in the inert gas atmosphere may be, for example, 90% by volume or more, and is preferably 98% by volume or more.

In the first raw material mixture, the ratio ($M^1/M^2$) of the total number of atoms of the element $M^1$ to the total number of atoms of the element $M^2$ contained as the composition of the mixture is, for example, 0.1 or more and 2.5 or less, preferably 0.2 or more and 2.0 or less, and more preferably 0.3 or more and 1.5 or less. In the composition of the first raw material mixture, the ratio (In/(In+Ga)) of the number of atoms of In to the total number of atoms of In and Ga is, for example, 0.1 or more and 1.0 or less, and preferably 0.25 or more and 0.99 or less. Furthermore, in the composition of the first raw material mixture, the ratio ($M^1/Z$) of the total number of atoms of the element $M^1$ to the total number of atoms of the element Z is, for example, 0.27 or more and 1.0 or less, and preferably 0.35 or more and 0.5 or less. When the first raw material mixture contains an alkali metal salt, the ratio ($M^a/(M^1+M^a)$) of the number of atoms of the alkali metal to the total number of atoms of the element $M^1$ and the alkali metal may be, for example, less than 1, and is preferably 0.8 or less, and more preferably 0.6 or less, 0.5 or less, 0.4 or less or 0.2 or less. The ratio may be, for example, more than 0, preferably 0.05 or more, and more preferably 0.1 or more.

The heat treatment step in the first production method may be a one-stage heat treatment step of heat-treating the first raw material mixture at a predetermined temperature, or may be a two-stage heat treatment step of heat-treating the first raw material mixture at a first temperature and then heat-treating the first raw material mixture at a second temperature higher than the first temperature. Performing heat treatment in two stages allows, for example, production of semiconductor nanoparticles having a relatively high intensity of band edge emission with better reproducibility. Here, the heat treatment at the first temperature and the heat treatment at the second temperature may be continuously performed, or the heat treatment may be performed by increasing temperature to the first temperature, decreasing temperature, and then increasing temperature to the second temperature.

When the heat treatment of the first raw material mixture is performed in a one-stage heat treatment step, the heat treatment temperature may be, for example, 180° C. or higher, and is preferably 200° C. or higher or 260° C. or higher. The heat treatment temperature may be, for example, 370° C. or lower, and is preferably 350° C. or lower or 320° C. or lower. The time of the heat treatment may be, for example, 1 minute or more, and is preferably 5 minutes or more, and more preferably 7 minutes or more. The time of the heat treatment may be, for example, 120 minutes or less, and is preferably 60 minutes or less, and more preferably 30 minutes or less, or 20 minutes or less.

When the heat treatment of the first raw material mixture is performed in a two-stage heat treatment step, the first temperature may be, for example, 30° C. or higher, and is preferably 100° C. or higher. The first temperature may be, for example, 200° C. or lower, and is preferably 180° C. or lower. The time of the heat treatment at the first temperature may be, for example, 1 minute or more, and is preferably 5 minutes or more, and more preferably 10 minutes or more. The time of the heat treatment at the first temperature may be, for example, 120 minutes or less, and is preferably 60 minutes or less, and more preferably 30 minutes or less.

The second temperature may be, for example, 180° C. or higher, and is preferably 200° C. or higher. The second temperature may be, for example, 370° C. or lower, and is preferably 350° C. or lower. The time of the heat treatment at the second temperature may be, for example, 1 minute or more, and is preferably 5 minutes or more, and more preferably 10 minutes or more. The time of the heat treatment at the second temperature may be, for example, 120 minutes or less, and is preferably 60 minutes or less, and more preferably 30 minutes or less.

The time of the heat treatment is set such that a time point at which the temperature reaches a predetermined temperature is defined as the start time of the heat treatment, and a time point at which an operation for decreasing or increasing the temperature is performed is defined as the end time of the heat treatment at the predetermined temperature. The temperature increasing rate until the temperature reaches a predetermined temperature is, for example, 1° C./min or more and 100° C./min or less, or ° C./min or more and 50° C./min or less. The temperature decreasing rate after the heat treatment is, for example, 1° C./min or more and 100° C./min or less, and cooling may be performed as needed, or it may be only required to leave the mixture to cool by stopping a heat source.

An atmosphere in the heat treatment step is preferably a rare gas atmosphere such as an argon atmosphere or an inert gas atmosphere such as a nitrogen atmosphere. Performing the heat treatment under an inert gas atmosphere allows reduction or prevention of generation of by-products of oxides, and also allows reduction or prevention of oxidation of the surface of the obtained semiconductor nanoparticles.

In the provision step in the second production method, a second raw material mixture containing at least one of salts containing the element $M^1$, and at least one of salts containing the element $M^2$ and an organic solvent, and optionally an alkali metal salt is provided. The second raw material mixture may be provided by mixing a salt containing the element $M^1$ and a salt containing the element $M^2$ with an organic solvent. The second raw material mixture may also be provided by mixing a salt containing the element $M^1$ or a salt containing the element $M^2$ with an organic solvent, and then mixing remaining components with the mixture. The obtained second raw material mixture may be in a state of a solution without undissolved substances in a state in which the temperature of the second raw material mixture has been increased. An atmosphere for mixing may be an inert gas atmosphere, for example, an argon atmosphere or a nitrogen atmosphere. Providing an inert gas atmosphere allows reduction or prevention of generation of by-products of oxides. The second raw material mixture may further contain an alkali metal salt.

The salt containing the element $M^1$, the salt containing the element $M^2$, the alkali metal salt and the organic solvent used in the second production method are the same as those used in the first production method.

The second raw material mixture may contain at least one of salts containing the element $M^1$ and at least one of salts containing the element $M^2$ without reacting with each other, or may contain them as a complex formed therefrom. In addition, the second raw material mixture may contain an $M^1$ complex formed from a salt containing the element $M^1$ and an $M^2$ complex formed from a salt containing the element $M^2$. The complex is formed, for example, by mixing a salt containing the element $M^1$ and a salt containing the element $M^2$ in an appropriate organic solvent.

In the second raw material mixture, the ratio ($M^1/M^2$) of the total number of atoms of the element $M^1$ to the total number of atoms of the element $M^2$ contained as the composition of the mixture is, for example, 0.1 or more and 2.5 or less, preferably 0.2 or more and 2.0 or less, and more preferably 0.3 or more and 1.5 or less. In the composition of the second raw material mixture, the ratio (In/(In+Ga)) of the number of atoms of In to the total number of atoms of In and Ga is, for example, 0.1 or more and 1.0 or less, and preferably 0.25 or more and 0.99 or less. When the second raw material mixture contains an alkali metal salt, the ratio ($M^a/(M^1+M^a)$) of the number of atoms of the alkali metal to the total number of atoms of the element $M^1$ and the alkali metal may be, for example, less than 1, and is preferably 0.8 or less, and more preferably 0.6 or less, 0.5 or less, 0.4 or less, or 0.2 or less. The ratio may be, for example, more than 0, preferably 0.05 or more, and more preferably 0.1 or more.

In the temperature increasing step in the second production method, the temperature of the provided second raw material mixture is increased to, for example, a temperature in a range of 120° C. or higher and 300° C. or lower. The temperature reached by increasing temperature is preferably 125° C. or higher, more preferably 130° C. or higher, and still more preferably 135° C. or higher, but is preferably 175° C. or lower, more preferably 160° C. or lower, and still more preferably 150° C. or lower. The temperature increasing rate is, for example, 1° C./min or more and 50° C./min or less, and preferably 10° C./min or more and 50° C./min or less.

An atmosphere in the temperature increasing step of the second raw material mixture is preferably an inert gas atmosphere, for example, an argon atmosphere or a nitrogen atmosphere. Providing an inert gas atmosphere allows reduction or prevention of generation of by-products of oxides.

In the addition step in the second production method, while the predetermined temperature is maintained, a source of the element Z is gradually added to the second raw material mixture whose temperature has been increased to a predetermined temperature so that the increase rate of the ratio of the number of atoms of the element Z to the number of atoms of the element $M^1$ in the mixture is, for example, 10/min or less. The increase rate of the ratio ($Z/M^1$ ratio) of the number of atoms of the element Z to the number of atoms of the element $M^1$ in the mixture is calculated, for example, by subtracting a $Z/M^1$ ratio at a certain time point from a $Z/M^1$ ratio after a lapse of a unit time and dividing the resulting value by a value obtained by converting the unit time into minutes. The unit time is optionally selected, for example, between 1 second and 1 minute. The increase rate of the ratio of the number of atoms of the element Z to the number of atoms of the element $M^1$ in the second raw material mixture is preferably 0.0001/min or more and 2/min or less, more preferably 0.0001/min or more and 1/min or less, still more preferably 0.001/min or more and 0.2/min or less, and particularly preferably 0.001/min or more and 0.1/min or less from the viewpoint of growth control of the particle to be generated. In addition, the rate is preferably 0.0002/min or more and 2/min or less, and more preferably 0.002/min or more and 0.2/min or less.

The total addition amount of the source of the element Z is an amount such that the ratio of the number of atoms of the element Z to the number of atoms of the element $M^1$ in the finally obtained mixture is 0.1 or more and 5.0 or less, and preferably 1.0 or more and 2.5 or less. Time required for adding the source of the element Z may be, for example, 1 minute or more, preferably 5 minutes or more, more preferably 15 minutes or more, and still more preferably 20 minutes or more, but is preferably 120 minutes or less, more preferably 60 minutes or less, and still more preferably 40 minutes or less.

When the total addition amount of the source of the element Z is an amount such that the ratio of the number of atoms of the element Z to the number of atoms of the element $M^1$ in the mixture is 0.1 or more and 2.5 or less, the increase rate of the $Z/M^1$ ratio is, for example, 0.0001/min or more and 1/min or less, and preferably 0.001/min or more and 0.1/min or less. When the total addition amount of the source of the element Z is an amount such that the ratio of the number of atoms of the element Z to the number of atoms of the element $M^1$ in the mixture is more than 2.5 and 5.0 or less, the increase rate of the $Z/M^1$ ratio is, for example, 0.0002/min or more and 2/min or less, and preferably 0.002/min or more and 0.2/min or less.

The addition of the source of the element Z may be performed in a manner that the addition amount per unit time is substantially the same over the required time. That is, a unit amount obtained by dividing the total addition amount of the source of the element Z by a number obtained by dividing the required time by the unit time may be added as the addition amount per unit time. The unit time may be, for example, 1 second, 5 seconds, 10 seconds, 30 seconds or 1 minute. The source of the element Z may be added in a continuous manner or a stepwise manner. The source of the element Z may also be added to the mixture under an inert gas atmosphere, for example.

The source of the element Z is the same as the source of the element Z used in the first production method. In particular, in the second production method, the source of S is preferably a sulfur-containing compound that is able to be dissolved in an organic solvent, and from the perspective of solubility and reactivity, alkylthiourea is preferably used, and 1,3-alkylthiourea is more preferably used. The number of carbon atoms of the alkyl group of alkylthiourea is preferably from 1 to 12, more preferably from 1 to 8, more preferably from 1 to 6, more preferably from 1 to 4, and still more preferably from 1 to 3. When alkylthiourea has a plurality of alkyl groups, they may be the same or different.

The source of the element Z may be added, as a solution in which a simple substance of the element Z or a compound containing the element Z is dispersed or dissolved in an organic solvent, to the second raw material mixture whose temperature has been increased. Use of the solution of the compound containing the element Z as the source of the element Z facilitates control of the addition amount of the source of the element Z per unit time in the addition step, and thus allows efficient production of the first semiconductor nanoparticles having a narrower particle size distribution.

As the organic solvent that dissolves the compound containing the element Z serving as a source of the element Z, the same organic solvent as the above-described organic solvent can be exemplified. For example, an amine having a hydrocarbon group having from 4 to 20 carbon atoms may be used.

When the source of the element Z is a solution of the compound containing the element Z, the concentration of the compound containing the element Z is, for example, 1 mmol/L or more and 500 mmol/L or less, and preferably 10 mmol/L or more and 50 mmol/L or less.

The second production method may further include a heat treatment step of heat-treating the mixture after the addition of the source of the element Z is completed at a temperature in a range of 120° C. or higher and 300° C. or lower. The temperature of the heat treatment may be the same as or different from a temperature to which the temperature of the mixture is increased. From the viewpoint of quantum yield, the temperature of the heat treatment is, for example, 120° C. or higher and 300° C. or lower, preferably 125° C. or higher and 175° C. or lower, more preferably 130° C. or higher and 160° C. or lower, and still more preferably 135° C. or higher and 150° C. or lower.

From the viewpoint of the quantum yield of the first semiconductor nanoparticles, the time of the heat treatment is, for example, 3 seconds or more, and preferably 5 minutes or more, 10 minutes or more, or 20 minutes or more. The upper limit of the heat treatment time is not particularly limited, but may be, for example, 60 minutes or less. The time for the heat treatment is set such that a time point at which the temperature reaches a predetermined temperature (for example, a time point at which the temperature reaches 140° C. in the case of 140° C.) is defined as the start time of the heat treatment, and a time point at which an operation for decreasing the temperature is performed is defined as the end time of the heat treatment.

The atmosphere of the heat treatment is preferably an inert gas atmosphere, for example, an argon atmosphere or a nitrogen atmosphere. Providing an inert gas atmosphere allows reduction or prevention of generation of by-products of oxides, and also allows reduction or prevention of oxidation of the surface of the obtained first semiconductor nanoparticles.

The second production method may include a cooling step of decreasing the temperature of a dispersion liquid containing the first semiconductor nanoparticles subsequent to the above-described step. The cooling step starts at a time point at which an operation for decreasing temperature is performed, and ends at a time point at which the dispersion liquid is cooled to 50° C. or lower.

The cooling step may include a period for which the temperature decreasing rate is 50° C./min or more, from the viewpoint of suppressing generation of silver sulfide from an unreacted Ag salt. For example, the temperature decreasing rate may be set to 50° C./min or more at a time point at which temperature starts to decrease after an operation for decreasing temperature has been performed.

The atmosphere of the cooling step is preferably an inert gas atmosphere, for example, an argon atmosphere or a nitrogen atmosphere. Providing an inert gas atmosphere allows reduction or prevention of generation of by-products of oxides, and also allows reduction or prevention of oxidation of the surface of the obtained first semiconductor nanoparticles.

The first production method or the second production method may further include a separation step of separating the obtained first semiconductor nanoparticles from the dispersion liquid, and may further include a purification step as needed. In the separation step, for example, a supernatant liquid containing the first semiconductor nanoparticles may be taken out by subjecting the dispersion liquid containing the first semiconductor nanoparticles to centrifugation. In the purification step, for example, the first semiconductor nanoparticles may be taken out as a precipitated product by adding an appropriate organic solvent such as alcohol to a supernatant liquid obtained in the separation step and then subjecting the mixture to centrifugation. The first semiconductor nanoparticles may also be taken out by volatilizing the organic solvent from the supernatant liquid. The taken precipitated product may be dried, for example, by vacuum degassing or natural drying, or a combination of vacuum degassing and natural drying. Natural drying may be performed, for example, by leaving the precipitated product to stand in the air at normal temperature and normal pressure, and in that case, the precipitated product may be left to stand for 20 hours or more, for example, about 30 hours. The taken precipitated product may be dispersed in an appropriate organic solvent.

In the first production method or the second production method, addition of an organic solvent such as alcohol and the purification step by centrifugation may be performed a plurality of times as needed. As the alcohol used for purification, a lower alcohol having from 1 to 4 carbon atoms, such as methanol, ethanol or n-propyl alcohol may be used. When the precipitated product is dispersed in an organic solvent, a halogen-based solvent such as chloroform, a hydrocarbon-based solvent such as toluene, cyclohexane, hexane, pentane or octane may be used as the organic solvent.

Second Step

In the second step in the method for producing semiconductor nanoparticles, a mixture (hereinafter, also referred to as a third raw material mixture) containing the provided first semiconductor nanoparticles, a first compound having a Ga—S bond, a second compound containing Ga and not containing S, and an organic solvent is heat-treated to obtain second semiconductor nanoparticles. The second step may include: a mixing step of obtaining a third raw material mixture containing the provided first semiconductor nanoparticles, a first compound having a Ga—S bond, a second compound containing Ga and not containing S, and an organic solvent; and a heat treatment step of heat-treating the obtained third raw material mixture to obtain second semiconductor nanoparticles.

Mixing Step

In the mixing step, the provided first semiconductor nanoparticles, a first compound having a Ga—S bond, a second compound containing Ga and not containing S, and an organic solvent are mixed to obtain a third raw material mixture. The third raw material mixture may be obtained by mixing the provided first semiconductor nanoparticles, a first compound and a second compound in an organic solvent. The organic solvent may be at least one selected from nitrogen-containing compounds having a hydrocarbon group having from 4 to 20 carbon atoms, or may be at least one selected from sulfur-containing compounds having a hydrocarbon group having from 4 to 20 carbon atoms, or may be a mixture thereof.

The provided first semiconductor nanoparticles may be used as a dispersion liquid to constitute the third raw material mixture. In a liquid in which the first semiconductor nanoparticles are dispersed, scattered light does not occur, and thus the dispersion liquid is generally obtained as a translucent (colored or colorless) liquid. A solvent for dispersing the first semiconductor nanoparticles may be an optional organic solvent as in the case of manufacturing the first semiconductor nanoparticles. For example, the organic solvent may be at least one selected from nitrogen-containing compounds having a hydrocarbon group having from 4 to 20 carbon atoms, or may be at least one selected from sulfur-containing compounds having a hydrocarbon group having from 4 to 20 carbon atoms, or may be a combination of at least one selected from nitrogen-containing compounds having a hydrocarbon group having from 4 to 20 carbon atoms and at least one selected from sulfur-containing compounds having a hydrocarbon group having from 4 to 20 carbon atoms. Specific examples of the nitrogen-containing compound include oleylamine, n-tetradecylamine and dodecanethiol.

The dispersion liquid of the first semiconductor nanoparticles may be provided so that the concentration of the particle in the dispersion liquid is, for example, $5.0 \times 10^{-8}$ mol/liter or more and $5.0 \times 10^{-4}$ mol/liter or less, and particularly $1.0 \times 10^{-7}$ mol/liter or more and $5.0 \times 10^{-5}$ mol/liter or less. When the proportion of the particle in the dispersion liquid is $5.0 \times 10^{-8}$ mol/liter or more, a generated product tends to be easily collected by an aggregation/precipitation process using a poor solvent. On the other hand, when the proportion is $5.0 \times 10^{-4}$ mol/liter or less, Ostwald ripening and fusion due to collision of materials constituting the first semiconductor nanoparticles are suppressed, and the particle size distribution tends to be suppressed from being widened.

The first compound is a compound having a Ga—S bond. The Ga—S bond may be any of a covalent bond, an ionic bond and a coordinate bond. Examples of the first compound include Ga salts of sulfur-containing compounds, and may be organic acid salts, inorganic acid salts or organic metal compounds, of Ga. Specific examples of the sulfur-containing compound include thiocarbamic acid, dithiocarbamic acid, thiocarbonate, dithiocarbonate (xanthogenic acid), trithiocarbonate, thiocarboxylic acid, dithiocarboxylic acid and derivatives thereof. Among them, at least one selected from the group consisting of xanthogenic acid and derivatives thereof is preferable because they decompose at a relatively low temperature. Specific examples of the sulfur-containing compound are the same as those described above. Specific examples of the compound having a Ga—S bond include gallium trisdimethyldithiocarbamate, gallium trisdiethyldithiocarbamate (Ga(DDTC)$_3$), gallium chlorobisdiethyldithiocarbamate and gallium ethylxanthogenate (Ga(EX)$_3$). The first mixture may solely contain one compound having a Ga—S bond, or may contain two or more compounds in combination.

The second compound is a compound containing Ga and not containing S. The second compound may be, for example, organic acid salts, inorganic acid salts or organic metal compounds, of Ga. Specific examples of the second compound include inorganic acid salts such as nitrate, sulfate, hydrochloride and sulfonate; and organic acid salts such as acetate and an acetylacetonate salt. The second compound is preferably an organic acid salt such as acetate and an acetylacetonate salt or hydrochloride because the solubility thereof in an organic solvent is high and reaction progresses more uniformly.

The second compound may be a compound containing Ga and substantially not containing S. Here, the term "substantially" is used in consideration of inevitably containing S due to contamination of impurities. Specifically, the term "substantially not containing S" means that the content of S in the second compound is, for example, 10% by mol or less, preferably 5% by mol or less, and more preferably 1% by mol or less.

The charged amount of the first compound and the second compound in the third raw material mixture may be selected in consideration of the amount of the first semiconductor nanoparticles contained in the dispersion liquid so that an attached substance or a semiconductor layer having a desired thickness is disposed on the first semiconductor nanoparticles present in the dispersion liquid. For example, the charged amounts of the first compound and the second compound may be determined such that a semiconductor compound having a stoichiometric composition consisting of Ga and S is generated in an amount of 0.1 µmol or more and 10 mmol or less, particularly in an amount of 5 µmol or more and 1 mmol or less, based on an amount of substance of 10 nmol as a particle of the first semiconductor nanoparticles. Note that the amount of substance as a particle is a molar amount when one first semiconductor nanoparticle is regarded as a large molecule, and is equal to a value obtained by dividing the number of particles of the first semiconductor nanoparticles contained in the dispersion liquid by the Avogadro's number (NA=$6.022 \times 10^{23}$).

The content of the first compound based on the amount of substance of the first semiconductor nanoparticles in the third raw material mixture may be, for example, $5.3 \times 10$ or more, and preferably $5.3 \times 10^2$ or more, or may be, for example, $8.5 \times 10^4$ or less, and preferably $4.3 \times 10^4$ or less as the molar ratio of S to the number of particles (mol) of the first semiconductor nanoparticles. In addition, the molar content ratio of the second compound in the third raw material mixture may be, for example, 1 or more and 10 or less, preferably 2 or more and 8 or less and more preferably 2 or more and 6 or less, based on Ga with respect to the number of moles of the first compound contained.

Examples of the organic solvent in the third raw material mixture include the same organic solvents as those in the first step, such as amines, thiols and phosphines. For example, the obtained second semiconductor nanoparticles may finally be surface-modified with the organic solvent. The organic solvent may be used in combination of two or more thereof, and for example, a mixed solvent obtained by combining at least one selected from thiols having a hydrocarbon group having from 4 to 20 carbon atoms and at least one selected from amines having a hydrocarbon group having from 4 to 20 carbon atoms may be used. In addition, two or more amines may be used in combination. Furthermore, these organic solvents may be mixed with another organic solvent (for example, a halogen-based solvent) and used.

Halogen Compound

The third raw material mixture may further contain a halogen compound. When the third raw material mixture contains a halogen compound, luminous efficiency may be further improved. This can be considered to be because, for example, gallium halide having good solubility in a solvent is generated by halogen ions generated from the halogen compound, whereby a lattice defect of a second semiconductor forming an attached substance or a semiconductor layer is repaired, and an attached substance or a semiconductor layer having an aligned atomic arrangement is formed.

Examples of the halogen compound include organic compounds containing a halogen atom and inorganic compounds containing a halogen atom. Examples of the halogen atom contained in the halogen compound include a fluorine atom, a chlorine atom, a bromine atom and an iodine atom. The halogen atom is preferably a chlorine atom or a bromine atom. The halogen atom contained in the halogen compound may be one type alone or a combination of two or more types. The halogen compound contained in the third raw material mixture may be one alone or a combination of two or more.

Examples of the organic compound containing a halogen atom include halogenated hydrocarbons and tetraalkylammonium halides. The number of carbon atoms of the organic compound containing a halogen atom may be, for example, 1 or more and 20 or less, and preferably 1 or more and 12 or less, or 1 or more and 6 or less. Specific examples of the halogenated hydrocarbon include dichloromethane, chloroform, tetrachloromethane, bromoform, hexachlorobenzene and chlorobenzene. Specific examples of the tetraalkylammonium halide include hexadecyltrimethylammonium chloride and hexadecyltrimethylammonium bromide.

Examples of the inorganic compound containing a halogen atom include hydrogen halides and metal halides. The hydrogen halide includes hydrogen chloride and hydrogen bromide. The metal halide includes gallium chloride.

When the third raw material mixture contains a halogen compound, the content thereof may be, for example, 0.1% by mass or more and 1.0% by mass or less, and preferably 0.15% by mass or more and 0.3% by mass or less, based on the third raw material mixture. In addition, the ratio of the halogen compound to the number of particles of the first semiconductor nanoparticles contained in the third raw material mixture may be, for example, 3,000 or more and 50,000 or less, and preferably 4,500 or more and 9,000 or less.

Heat Treatment Step

In the heat treatment step, the third raw material mixture is heat-treated to precipitate a semiconductor containing Ga and S (hereinafter, also referred to as "second semiconductor") on the surface of the first semiconductor nanoparticles, thereby obtaining second semiconductor nanoparticles. In one aspect of the heat treatment step in the method for producing semiconductor nanoparticles, for example, the third raw material mixture is heat-treated at a predetermined temperature to dispose a layer of the second semiconductor on the surface of the first semiconductor nanoparticles, thereby obtaining second semiconductor nanoparticles (heating-up method). Specifically, the third raw material mixture may be heated in such a manner that the temperature of the third raw material mixture is gradually increased so that peak temperature thereof is 200° C. or higher and 310° C. or lower, the temperature is maintained at the peak temperature for a predetermined time, and then the temperature is gradually decreased. The temperature increasing rate may be, for example, 1° C./min or more and 50° C./min or less, but is preferably 50° C./min or more and 100° C./min or less up to 200° C. in order to reduce to the extent possible deterioration of the first semiconductor nanoparticles caused by continuous heat treatment in the absence of the layer of the second semiconductor. When it is desired to further increase temperature to 200° C. or higher, the temperature increasing rate is preferably 1° C./min or more and 5° C./min or less thereafter. The temperature decreasing rate may be, for example, 1° C./min or more and 50° C./min or less. When the peak temperature is 200° C. or higher, formation of the layer of the second semiconductor (for example, a shell) tends to be sufficiently performed for reasons such as sufficient progress of a chemical reaction for generating the second semiconductor. When the peak temperature is 310° C. or lower, deterioration of the semiconductor nanoparticles is suppressed, so that good band edge emission tends to be obtained. The time for maintaining the peak temperature may be, for example, 1 minute or more and 300 minutes or less, and particularly 10 minutes or more and 120 minutes or less. The time for maintaining the peak temperature is selected in relation to the peak temperature, and when the maintaining time is made longer in the case of a lower peak temperature, and when the maintaining time is made shorter in the case of a higher peak temperature, a good layer of the second semiconductor is easily disposed.

Another aspect of the heat treatment step in the method for producing semiconductor nanoparticles may be a two-stage heat treatment step of performing heat treatment at a first temperature and then performing heat treatment at a second temperature higher than the first temperature. Performing heat treatment in two stages allows, for example, production of semiconductor nanoparticles having a higher intensity of band edge emission with better reproducibility. Here, the heat treatment at the first temperature and the heat treatment at the second temperature may be continuously performed, or the heat treatment may be performed by increasing temperature to the first temperature, decreasing temperature, and then increasing temperature to the second temperature.

When the heat treatment of the third raw material mixture is performed in a two-stage heat treatment step, the first temperature may be, for example, 30° C. or higher, and is preferably 100° C. or higher. The first temperature may be, for example, 200° C. or lower, and is preferably 180° C. or lower. The time of the heat treatment at the first temperature may be, for example, 1 minute or more, and is preferably 5 minutes or more, and more preferably 7 minutes or more. The time of the heat treatment at the first temperature may be, for example, 120 minutes or less, and is preferably 60 minutes or less, and more preferably 30 minutes or less or 20 minutes or less.

The second temperature may be, for example, 180° C. or higher, and is preferably 200° C. or higher. The second temperature may be, for example, 350° C. or lower, and is preferably 330° C. or lower or 310° C. or lower. The time of the heat treatment at the second temperature may be, for example, 1 minute or more, and is preferably 5 minutes or more, and more preferably 10 minutes or more or 20 minutes or more. The time of the heat treatment at the second temperature may be, for example, 120 minutes or less, and is preferably 90 minutes or less, more preferably 60 minutes or less or 40 minutes or less.

In another aspect of the heat treatment step in the method for producing semiconductor nanoparticles, the layer of the second semiconductor may be formed by a method in which the temperature of the dispersion liquid containing the first semiconductor nanoparticles is increased so that the peak temperature thereof is 200° C. or higher and 310° C. or lower, a mixed liquid obtained by previously dispersing or dissolving the first compound and the second compound in an organic solvent is added little by little in a state of maintaining the peak temperature after the temperature reaches the peak temperature, and then the temperature is decreased (slow injection method). In this case, the heat treatment is started immediately after the dispersion liquid containing the first semiconductor nanoparticles and the mixed liquid are mixed and the third raw material mixture is obtained. The mixed liquid containing the first compound and the second compound may be added at a rate of 0.1 mL/hour or more and 10 mL/hour or less, particularly 1 mL/hour or more and 5 mL/hour or less. The peak temperature may be maintained as necessary after the addition of the mixed liquid has been completed.

When the peak temperature is 200° C. or higher, formation of the layer of the second semiconductor (for example, a shell) tends to be sufficiently performed for reasons such as sufficient progress of a chemical reaction for generating the second semiconductor. When the peak temperature is 310° C. or lower, deterioration of the semiconductor nanoparticles is suppressed, so that good band edge emission tends to be obtained. The time for maintaining the peak temperature may be 1 minute or more and 300 minutes or less in total, particularly 10 minutes or more and 120 minutes or less after the start of the addition of the mixed liquid containing the first compound and the second compound. The time for maintaining the peak temperature is selected in relation to the peak temperature, and when the maintaining time is made longer in the case of a lower peak temperature, and when the maintaining time is made shorter in the case of a higher peak temperature, a good layer of the second semiconductor is easily disposed. The temperature increasing rate and the temperature decreasing rate are not particularly limited, and temperature decrease may be performed by, for example, maintaining the temperature at the peak temperature for a predetermined time, and then stopping heating by a heating source (for example, an electric heater) and leaving the mixture to cool.

The time of the heat treatment in the heat treatment step is set such that a time point at which the temperature reaches a predetermined temperature is defined as the start time of the heat treatment, and a time point at which an operation for decreasing or increasing the temperature is performed is defined as the end time of the heat treatment at a predetermined temperature. The temperature increasing rate until the temperature reaches a predetermined temperature is, for example, 1° C./min or more and 100° C./min or less, or 1° C./min or more and 50° C./min or less. The temperature decreasing rate after the heat treatment is, for example, 1° C./min or more and 100° C./min or less, and cooling may be performed as needed, or it may be only required to leave the mixture to cool by stopping a heat source.

The atmosphere of the heat treatment is preferably an inert gas atmosphere, for example, an argon atmosphere or a nitrogen atmosphere. Providing an inert gas atmosphere allows reduction or prevention of by-products of oxides.

The heat treatment step may further include an addition step of adding a halogen compound to the third raw material mixture being heated. When the halogen compound is added, luminous efficiency may be further improved. Details of the halogen compound to be added and the addition amount thereof are as described above. The temperature at which the halogen compound is added may be, for example, 30° C. or higher and 330° C. or lower, and is preferably 200° C. or higher and 310° C. or lower.

The second step may further include a contact step of bringing a halogen compound into contact with the second semiconductor nanoparticles obtained after completion of the heat treatment step. When the halogen compound is brought into contact with the second semiconductor nanoparticles, luminous efficiency may be further improved. The details of the halogen compound to be contacted and the amount to be contacted are as described above. The contact between the second semiconductor nanoparticles and the halogen compound may be performed by mixing a heat-treated product of the third raw material mixture and the halogen compound. The contact temperature may be, for example, 80° C. or higher and 330° C. or lower, and preferably 180° C. or higher and 260° C. or lower. The contact time may be, for example, 10 minutes or more and 12 hours or less.

In this way, semiconductor nanoparticles is formed as second semiconductor nanoparticles (for example, core-shell type semiconductor nanoparticles having a core-shell structure). The obtained semiconductor nanoparticles may be separated from the dispersion liquid, and may be further purified and dried as needed. Since methods for separation, purification, and drying are as described above in relation to the first semiconductor nanoparticles, the detailed description thereof is omitted here.

The method for producing semiconductor nanoparticles may further include a modification step of disposing a surface modifying agent on the second semiconductor nanoparticles obtained in the heat treatment step. The modification step may include, for example, bringing the second semiconductor nanoparticles obtained in the heat treatment step into contact with a surface modifying agent, and may include bringing the second semiconductor nanoparticles obtained in the heat treatment step into contact with a specific modifying agent containing phosphorus (P) having a negative oxidation number. Thereby, semiconductor nanoparticles exhibiting band edge emission with a better quantum yield is produced.

The specific modifying agent contains P having a negative oxidation number as the group 15 element. The oxidation number of P is −1 when one hydrogen atom or hydrocarbon group is bonded to P, and is +1 when one oxygen atom is bonded by a single bond, and changes depending on the substitution state of P. For example, the oxidation number of P in trialkylphosphine and triarylphosphine is −3, and that in trialkylphosphine oxide and triarylphosphine oxide is −1.

The specific modifying agent may contain another group 15 element in addition to P having a negative oxidation number. Examples of the other group 15 element include N, As and Sb.

The specific modifying agent may be, for example, a phosphorus-containing compound having a hydrocarbon group having from 4 to 20 carbon atoms. Examples of the hydrocarbon group having from 4 to 20 carbon atoms include linear or branched saturated aliphatic hydrocarbon groups such as an n-butyl group, an isobutyl group, an n-pentyl group, an n-hexyl group, an octyl group, an ethylhexyl group, a decyl group, a dodecyl group, a tetradecyl group, a hexadecyl group and an octadecyl group; linear or branched unsaturated aliphatic hydrocarbon groups such as an oleyl group; alicyclic hydrocarbon groups such as a cyclopentyl group and a cyclohexyl group; aromatic hydrocarbon groups such as a phenyl group and a naphthyl group; and arylalkyl groups such as a benzyl group and a naphthylmethyl group. Among them, a saturated aliphatic hydrocarbon group and an unsaturated aliphatic hydrocarbon group are preferable. When the specific modifying agent has a plurality of hydrocarbon groups, they may be the same or different.

Specific examples of the specific modifying agent include tributylphosphine, triisobutylphosphine, tripentylphosphine, trihexylphosphine, trioctylphosphine, tris(ethylhexyl)phosphine, tridecylphosphine, tridodecylphosphine, tritetradecylphosphine, trihexadecylphosphine, trioctadecylphosphine, triphenylphosphine, tributylphosphine oxide, triisobutylphosphine oxide, tripentylphosphine oxide, trihexylphosphine oxide, trioctylphosphine oxide, tris(ethylhexyl)phosphine oxide, tridecylphosphine oxide, tridodecylphosphine oxide, tritetradecylphosphine oxide, trihexadecylphosphine oxide, trioctadecylphosphine oxide and triphenylphosphine oxide, and at least one selected from the group consisting of these is preferred.

The contact between the second semiconductor nanoparticles and the specific modifying agent may be performed, for example, by mixing a dispersion liquid of the second semiconductor nanoparticles with the specific modifying agent. The second semiconductor nanoparticles may also be mixed with a liquid specific modifying agent. As the specific modifying agent, a solution thereof may be used. The dispersion liquid of the second semiconductor nanoparticles is obtained by mixing the second semiconductor nanoparticles with an appropriate organic solvent. Examples of the organic solvent used for dispersion include halogen solvents such as chloroform; aromatic hydrocarbon solvents such as toluene; and aliphatic hydrocarbon solvents such as cyclohexane, hexane, pentane and octane. The concentration in terms of the amount of substance of the second semiconductor nanoparticles in the dispersion liquid is, for example, $1 \times 10^{-7}$ mol/L or more and $1 \times 10^{-3}$ mol/L or less, and preferably $1 \times 10^{-6}$ mol/L or more and $1 \times 10^{-4}$ mol/L or less.

The used amount of the specific modifying agent with respect to the second semiconductor nanoparticles is, for example, 1 time or more and 50,000 times or less in terms of molar ratio. When the dispersion liquid of the second semiconductor nanoparticles in which the concentration in terms of the amount of substance of the second semiconductor nanoparticles in the dispersion liquid is $1.0 \times 10^{-7}$ mol/L or more and $1.0 \times 10^{-3}$ mol/L or less is used, the dispersion liquid and the specific modifying agent may be mixed at a volume ratio of from 1:1,000 to 1,000:1.

The temperature at the time of contact between the second semiconductor nanoparticles and the specific modifying agent is, for example, 0.100° C. or higher and 100° C. or lower, or 30° C. or higher and 75° C. or lower. The contact time may be appropriately selected according to the used amount of the specific modifying agent and the concentration of the dispersion liquid. The contact time is, for example, 1 minute or more, preferably 1 hour or more, and 100 hours or less, preferably 48 hours or less. The atmosphere at the time of contact is, for example, an inert gas atmosphere such as a nitrogen gas atmosphere or a rare gas atmosphere.

Light-Emitting Device

A light-emitting device includes a light conversion member and a semiconductor light-emitting element, and the light conversion member contains the semiconductor nanoparticles (for example, a core-shell type semiconductor nanoparticles) obtained by the production method described above. According to this light-emitting device, for example, a part of light emitted from the semiconductor light-emitting element is absorbed by the semiconductor nanoparticles, and light having a longer wavelength is emitted. Then, light from the semiconductor nanoparticles and the rest of light emission from the semiconductor light-emitting element are mixed, and the mixed light may be used as light emission of the light-emitting device.

The semiconductor nanoparticles obtained by the above production method has good luminous efficiency due to the production method. In the semiconductor nanoparticles produced by the above production method, for example, it is considered that, generation of a lattice defect is suppressed in the semiconductor layer on the surface (for example, a shell), improving luminous efficiency as compared with core-shell type semiconductor nanoparticles obtained by conventional production methods. The crystal structure of the semiconductor layer on the surface may be examined by, for example, a method such as X-ray diffraction. However, the presence or absence of a lattice defect in the semiconductor layer on the surface is merely a slight difference in the crystal structure, and it is considered that the analysis thereof is technically difficult. It is therefore technically impossible or not practical at the present time to specifically clarify the detailed aspect of the crystal structure in the semiconductor layer on the surface.

Specifically, when a semiconductor light-emitting element that emits blue-violet light or blue light having a peak wavelength of about 400 nm or more and 490 nm or less is used and a semiconductor nanoparticles that absorbs blue light and emits yellow light is used, a light-emitting device that emits white light may be obtained. Alternatively, a white light-emitting device may also be obtained by using two types of semiconductor nanoparticles, one that absorbs blue light and emits green light and the other that absorbs blue light and emits red light.

Alternatively, a white light-emitting device may also be obtained when a semiconductor light-emitting element that emits ultraviolet light having a peak wavelength of 400 nm or less is used, and three types of semiconductor nanoparticles that absorb ultraviolet light and emit blue light, green light and red light, respectively, are used. In this case, it is desirable to cause the semiconductor nanoparticles to absorb and convert all the light from the light-emitting element so that the ultraviolet light emitted from the light-emitting element does not leak to the outside.

Alternatively, a device that emits white light may be obtained when a semiconductor light-emitting element that emits blue-green light having a peak wavelength of about 490 nm or more and 510 nm or less is used, and semiconductor nanoparticles that absorbs the blue-green light and emits red light is used as the semiconductor nanoparticles.

Alternatively, a semiconductor light-emitting element that emits visible light is used as the semiconductor light-emitting element, and for example, a semiconductor light-emitting element that emits red light having a wavelength of 700 nm or more and 780 nm or less is used. When semiconductor nanoparticles that absorbs visible light and emits near infrared rays is used, a light-emitting device that emits near infrared rays may also be obtained.

The semiconductor nanoparticles may be used in combination with another semiconductor quantum dot, or may be used in combination with a fluorescent material (for example, an organic fluorescent material or an inorganic fluorescent material) that is not another quantum dot. The other semiconductor quantum dot is, for example, the binary semiconductor quantum dot described in the section of description of related art. As the fluorescent material that is not a quantum dot, a garnet-based fluorescent material such as an aluminum garnet-based fluorescent material may be used. Examples of the garnet-based fluorescent material include yttrium-aluminum-garnet-based fluorescent materials activated with cerium and lutetium-aluminum-garnet-based fluorescent materials activated with cerium. In addition, nitrogen-containing calcium alunminosilicate-based fluorescent materials activated with europium and/or chromium, silicate-based fluorescent materials activated with europium, β-SiAlON-based fluorescent materials, nitride-based fluorescent materials such as a CASN-based fluorescent material or a SCASN-based fluorescent material, rare-earth nitride-based fluorescent materials such as a $LnSi_3Nu$-based fluorescent material or a LnSiAlON-based fluorescent material, oxynitride-based fluorescent materials such as a $BaSi_2O_2N_2$:Eu-based fluorescent material or a $Ba_3Si_6O_{12}N_2$:Eu-based fluorescent material, sulfide-based fluorescent materials such as a CaS-based fluorescent material, a $SrGa_2S_4$-based fluorescent material, or a ZnS-based fluorescent material, chlorosilicate-based fluorescent materials, a $SrLiAl_3N_4$:Eu fluorescent material, a $SrMg_3SiN_4$:Eu fluorescent material and a $K_2(Si, A)F_6$:Mn fluorescent material as a fluoride complex fluorescent material activated with manganese may be used. In the formula representing the composition of the fluorescent material, a plurality of elements separated by a comma (,) means that at least one element of the plurality of elements is contained in the composition. In the formula representing the composition of the fluorescent material, the part before the colon (:) represents a host crystal, and the part after the colon (:) represents an activation element.

In the light-emitting device, the light conversion member containing the semiconductor nanoparticles may be, for example, a sheet or a plate-like member, or may be a member having a three-dimensional shape. An example of the member having a three-dimensional shape is an encapsulant formed by filling a recess portion with a resin in order to encapsulate a semiconductor light-emitting element when the light-emitting element is disposed on the bottom surface of the recess portion formed in a package in a surface mount type light-emitting diode.

Alternatively, in a case where the semiconductor light-emitting element is disposed on a planar substrate, another example of the light conversion member is a resin member formed so as to surround, with a substantially uniform thickness, the upper surface and the lateral surface of the semiconductor light-emitting element. Alternatively, in a case where the periphery of the semiconductor light-emitting element is filled with a resin member containing a reflecting material such that the upper end of the resin member forms the same plane as the semiconductor light-emitting element, still another example of the light conversion member is a resin member formed in a flat plate shape with a predetermined thickness on the semiconductor light-emitting element and the resin member containing a reflecting material.

The light conversion member may be in contact with the semiconductor light-emitting element or may be provided away from the semiconductor light-emitting element. Specifically, the light conversion member may be a pellet-like member, a sheet-like member, a plate-like member or a rod-like member disposed away from the semiconductor light-emitting element, or may be a member provided in contact with the semiconductor light-emitting element, for example, an encapsulant, a coating member (a member that covers the light-emitting element and is provided separately from a mold member) or a mold member (for example, it includes a member having a lens shape).

When two or more types of semiconductor nanoparticles that emit light of different wavelengths are used in the light-emitting device, two or more types of semiconductor nanoparticles may be mixed in one light conversion member, or two or more light conversion members each containing only one type of semiconductor nanoparticles may be used in combination. In this case, the two or more types of light conversion members may form a stacked structure, or may be disposed in a dotted or stripe pattern on a plane.

Examples of the semiconductor light-emitting element include LED chips. The LED chip may include a semiconductor layer consisting of one or more compounds selected from the group consisting of GaN, GaAs, InGaN, AlInGaP, GaP, SiC and ZnO. The semiconductor light-emitting element that emits blue-violet light, blue light or ultraviolet light contains, for example, a GaN-based compound having a composition represented by $In_XAl_YGa_{1-X-Y}N$ ($0 \leq X$, $0 \leq Y$, $X+Y<1$) as a semiconductor layer.

The light-emitting device of the present embodiment is preferably incorporated in a liquid crystal display apparatus as a light source. Since band edge emission by the semiconductor nanoparticles has a short emission lifetime, a light-emitting device using the semiconductor nanoparticles is suitable for a light source of a liquid crystal display apparatus requiring a relatively high response rate. In addition, the semiconductor nanoparticles of the present embodiment may show an emission peak having a small half-width as band edge emission. Therefore, in a light-emitting device, blue light having a peak wavelength within a range of 420 nm or more and 490 nm or less is obtained by a blue semiconductor light-emitting element, and green light having a peak wavelength within a range of 510 nm or more and 550 nm or less, preferably 530 nm or more and 540 nm or less and red light having a peak wavelength within a range of 600 nm or more and 680 nm or less, preferably 630 nm or more and 650 nm or less are obtained by semiconductor nanoparticles. Alternatively, in a light-emitting device, ultraviolet light having a peak wavelength of 400 nm or less is obtained by a semiconductor light-emitting element, and blue light having a peak wavelength within a range of 430 nm or more and 470 nm or less, preferably 440 nm or more and 460 nm or less, green light having a peak wavelength within a range of 510 nm or more and 550 nm or less, preferably 530 nm or more and 540 nm or less and red light having a peak wavelength within a range of 600 nm or more and 680 nm or less, preferably 630 nm or more and 650 nm or less are obtained by semiconductor nanoparticles.

Accordingly, a liquid crystal display apparatus with good color reproducibility can be provided without using a thick color filter. The light-emitting device is used, for example, as a direct-type backlight or as an edge-type backlight.

Alternatively, a sheet, a plate-like member or a rod formed of resin or glass, which contains semiconductor nanoparticles, may be incorporated, as a light conversion member independent of the light-emitting device, in the liquid crystal display apparatus.

EXAMPLES

Hereinafter, the present disclosure will be specifically described with reference to Examples, but the present invention is not limited to these Examples.

Example 1

Synthesis of First Semiconductor Nanoparticles

In a reaction vessel, 400 µmol of silver acetate (AgOAc) and 400 µmol of indium acetate (In(OAc)$_3$) were mixed with 8 mL of oleylamine (OLA) which has been distilled and purified, and dodecanethiol (1.25 mmol, 300 µL) was added to the mixture to obtain a solution A. Separately, 0.8 mmol of 1,3-dimethylthiourea was dissolved in 2 mL of oleylamine to obtain a solution B. The solution A was degassed, the atmosphere of the reaction vessel was replaced with an argon atmosphere, and then the solution A was heated to 140° C. Thereafter, the liquid B was added dropwise to the liquid A over 30 minutes (increase rate of the ratio of the number of atoms of S to the number of atoms of Ag in the mixture: 0.067/min). After completion of the dropwise addition, the temperature of the liquid mixture was maintained at 140° C. for 30 minutes. Subsequently, the mixture was left to cool to room temperature, coarse particles were removed by centrifugation, methanol was added to a supernatant to precipitate first semiconductor nanoparticles, and the first semiconductor nanoparticles were recovered by centrifugation. The collected solid was dispersed in 2 mL of oleylamine.

The X-ray diffraction (XRD) pattern of the obtained first semiconductor nanoparticles was measured and compared with tetragonal (chalcopyrite type) AgInS$_2$ and orthorhombic AgInS$_2$. The measured XRD pattern is shown in FIG. 1. It was confirmed from the XRD pattern that the crystal structure of the obtained first semiconductor nanoparticles had substantially the same structure as that of tetragonal AgInS$_2$ because no peak around 48° that would observed in orthorhombic AgInS$_2$ was observed. The XRD pattern was measured using a powder X-ray diffraction apparatus (trade name: SmartLab) manufactured by Rigaku Corporation.

In addition, the shape of the obtained first semiconductor nanoparticles was observed using a transmission electron microscope (TEM, manufactured by Hitachi High-Tech Corporation, trade name H-7650), and the average particle size thereof was measured from a TEM image taken at a magnification of from 80,000 to 200,000. Here, as a TEM grid, trade name: High Resolution Carbon HRC-C10 STEM Cu 100P grid (manufactured by Okenshoji Co., Ltd.) was used. The shape of the obtained particle is considered to be spherical or polygonal. The average particle size was determined by a method in which three or more TEM images were selected, the particle sizes were measured for all measurable nanoparticles among the nanoparticles included in the TEM images, that is, all particles except for those in which the image of the particle was cut at the edge of the image, and the arithmetic average thereof was determined.

In both Examples and Comparative Examples described later, the particle sizes of a total of 100 or more nanoparticles were measured using three or more TEM images. The average particle size of the first semiconductor nanoparticles was 4.68 nm, and the standard deviation thereof was 0.36 nm.

The amount of substance of indium contained in the first semiconductor nanoparticles subsequently obtained was determined by ICP emission spectrometry (Shimadzu Corporation, ICPS-7510) and found to be 43.5 µmol. The volume of the first semiconductor nanoparticles when the average particle size is 4.68 nm is calculated to be 53.67 nm$^3$ when the first semiconductor nanoparticles is spherical. In addition, the unit lattice volume of a silver indium sulfide crystal in the case of a tetragonal crystal was calculated to be 0.38 nm$^3$ (lattice constant: 0.528 nm, 0.5828 nm, 1.119 nm). Thus, by dividing the volume of the first semiconductor nanoparticles by the obtained unit lattice volume, it was found that 141 unit lattices were included in one first semiconductor nanoparticle. Subsequently, one unit lattice of the silver indium sulfide crystal in the case of a tetragonal crystal include four indium atoms, and thus it was found from calculation that 564 indium atoms were included per nanoparticle. By dividing the amount of substance of indium by the number of indium atoms per nanoparticle, the amount of semiconductor nanoparticles as a nanoparticle was calculated to be 77.1 nmol.

Synthesis of Semiconductor Nanoparticles (Core-Shell Type Semiconductor Nanoparticles)

Twenty µmol of gallium diethyldithiocarbamate (Ga(DDTC)$_3$), 80 µmol of gallium acetylacetonate (Ga(acac)$_3$) and 7 ml of oleylamine were weighed, and then, the oleylamine dispersion liquid of the first semiconductor nanoparticles synthesized above was added in an amount corresponding to 30 nmol in nanoparticle concentration. The obtained solution was degassed at about 100° C., and the atmosphere was replaced with an argon atmosphere. Then, the temperature of the solution was rapidly increased until it reaches 230° C. (temperature increasing rate: about 60° C./min), at a temperature of 230° C. or higher, the temperature was further increased to 280° C. at a rate of 2° C./min, and the solution was heat-treated at 280° C. for 2 minutes, and then left to cool. Subsequently, a vacuum degassing operation was performed for 1 minute when the temperature was decreased to 120° C., and then Ar was introduced. The solution was further left to cool to 80° C., and hexane and ethanol were added thereto. After the solution was left to cool to room temperature, the solution was subjected to centrifugation to collect only a supernatant solution. Then, methanol was added to the obtained supernatant solution, and centrifugation was performed to obtain a precipitated product of semiconductor nanoparticles.

Measurement of Absorption Spectrum, Emission Spectrum and Quantum Yield

Figure 2:
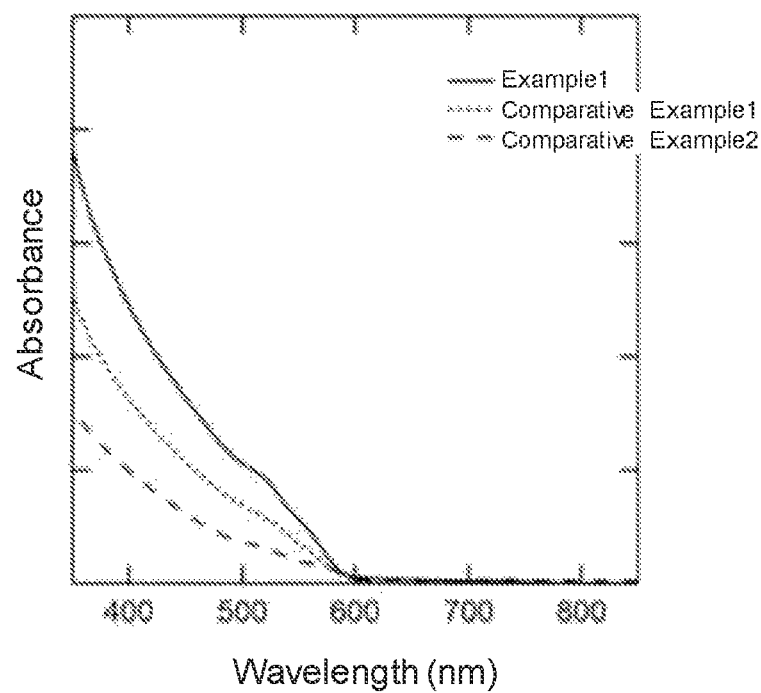
FIG. 2 shows exemplary absorption spectra of semiconductor nanoparticles according to Example 1, Comparative Example 1 and Comparative Example 2.
Figure 3:
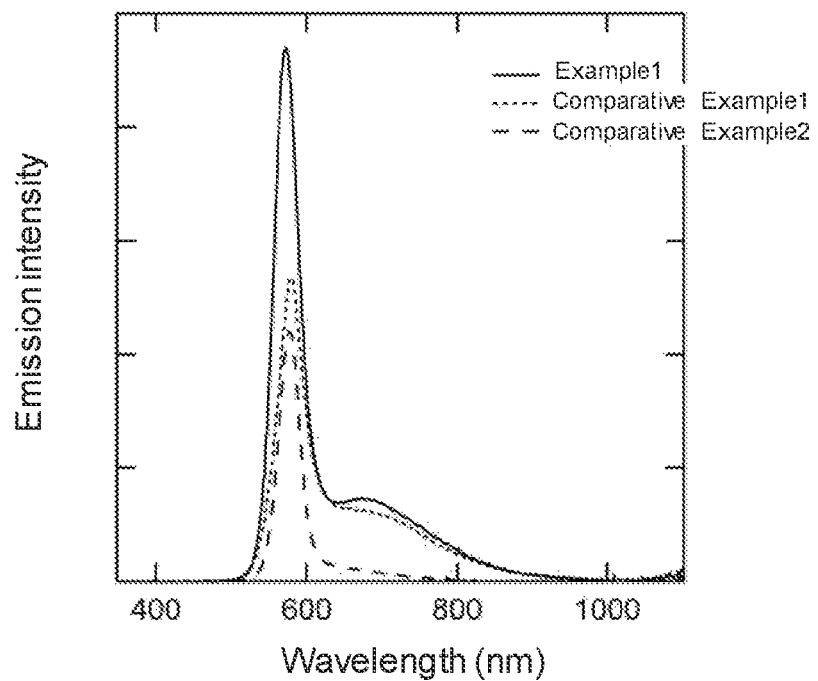
FIG. 3 shows exemplary emission spectra of semiconductor nanoparticles according to Example 1, Comparative Example 1 and Comparative Example 2.

The absorption spectrum and emission spectrum of the semiconductor nanoparticles were measured. The results are shown in Table 1. The absorption spectrum is shown in FIG. 2, and the emission spectrum is shown in FIG. 3. The absorption spectrum was measured at a wavelength range of 350 nm to 850 nm using an ultraviolet-visible near-infrared spectrophotometer (trade name: V-670, manufactured by JASCO Corporation). The emission spectrum was measured using a spectrofluorometer (trade name: FP-8600, manufactured by JASCO Corporation), and also the quantum yield was measured using a fluorescence spectrum measuring apparatus PMA-12 (manufactured by Hamamatsu Photonics K.K.) equipped with an integrating sphere, at an excitation wavelength of 450 nm at room temperature (25° C.) in a wavelength range of from 350 nm to 1,100 nm, and calculation was performed in a wavelength range of from 470 nm to 900 nm.

As shown in FIG. 2, in the absorption spectrum of the semiconductor nanoparticles, a shoulder peak was slightly observed around 500 nm, and it was confirmed that there was almost no absorption at a wavelength of higher than a wavelength around 580 nm. It is therefore presumed that there is an exciton peak around a wavelength of from 400 nm to 580 nm. In addition, as shown in FIG. 3, in the emission spectrum of the semiconductor nanoparticles, band edge emission having a half-width of about 39 nm was observed around 572 nm, the quantum yield of band edge emission was 21%, and the purity of band edge emission components was 53%.

Comparative Example 1

Synthesis of Semiconductor Nanoparticles

One hundred μmol of gallium acetylacetonate (Ga(acac)$_3$) and 100 μmol of 1,3-dimethylthiourea were weighed, and added to 8 mL of oleylamine which has been distilled and purified, and then, an oleylamine dispersion liquid of the first semiconductor nanoparticles synthesized in the same manner as in Example 1 was added thereto in an amount corresponding to 30 nmol in nanoparticle concentration. The obtained solution was degassed at about 60° C., and the atmosphere was replaced with an argon atmosphere. Then, the temperature of the solution was rapidly increased until it reached 230° C. (temperature increasing rate: about 60° C./min), at a temperature of 230° C. or higher, the temperature was further increased to 280° C. at a rate of 2° C./min, and the solution was heat-treat at 280° C. for 30 minutes. Subsequently, the solution was left to cool to room temperature, methanol was added to precipitate semiconductor particles, and the semiconductor nanoparticles were washed. Then, the obtained semiconductor nanoparticles were dispersed in chloroform.

Measurement of Absorption Spectrum, Emission Spectrum and Quantum Yield

The absorption spectrum and emission spectrum of the semiconductor nanoparticles were measured in the same manner as in Example 1. The results are shown in Table 1. FIG. 2 shows an absorption spectrum of relative absorbance normalized by the maximum absorbance of the semiconductor nanoparticles of Example 1. FIG. 3 shows an emission spectrum of relative emission intensity normalized by the maximum emission intensity of the semiconductor nanoparticles of Example 1. As shown in FIG. 2, in the absorption spectrum of the semiconductor nanoparticles, a shoulder peak was slightly observed around 500 nm, and it was confirmed that there was almost no absorption at a wavelength of higher than a wavelength around 580 nm. It is therefore presumed that there is an exciton peak around a wavelength of from 400 nm to 580 nm. In addition, as shown in FIG. 3, in the emission spectrum of the semiconductor nanoparticles, band edge emission having a half-width of about 41 nm was observed around 579 nm, the quantum yield of band edge emission was 15%, and the purity of band edge emission components was 42%.

Comparative Example 2

Synthesis of Semiconductor Nanoparticles

One hundred μmol of gallium diethyldithiocarbamate (Ga(DDTC)$_3$) and 7 g of tetradecylamine were weighed, and then, an oleylamine dispersion liquid of the first semiconductor nanoparticles synthesized in the same manner as in Example 1 was added thereto in an amount corresponding to 30 nmol in nanoparticle concentration. The obtained solution was degassed at about 60° C., and the atmosphere was replaced with an argon atmosphere. Then, the temperature of the solution was rapidly increased until it reached 230° C. (temperature increasing rate: about 60° C./min), at a temperature of 230° C. or higher, the temperature was further increased to 280° C. at a rate of 2° C./min, and the solution was heat-treated at 280° C. for 2 minutes, and then left to cool. Subsequently, a vacuum degassing operation was performed for 1 minute when the temperature was decreased to 120° C., and then Ar was introduced. The solution was further left to cool to 80° C., and hexane and ethanol were added thereto. After the solution was left to cool to room temperature, the solution was subjected to centrifugation to collect only a supernatant solution. Then, methanol was added to the obtained supernatant solution, and centrifugation was performed to obtain a precipitated product of a semiconductor nanoparticles.

Measurement of Absorption Spectrum, Emission Spectrum and Quantum Yield

The absorption spectrum and emission spectrum of the semiconductor nanoparticles were measured in the same manner as in Example 1. The results are shown in Table 1. FIG. 2 shows an absorption spectrum of relative absorbance normalized by the maximum absorbance of the semiconductor nanoparticles of Example 1. FIG. 3 shows an emission spectrum of relative emission intensity normalized by the maximum emission intensity of the semiconductor nanoparticles of Example 1. As shown in FIG. 2, in the absorption spectrum of the semiconductor nanoparticles, a shoulder peak was slightly observed around 500 nm, and it was confirmed that there was almost no absorption at a wavelength of higher than a wavelength around 580 nm. It is therefore presumed that there is an exciton peak around a wavelength of from 400 nm to 580 nm. In addition, as shown in FIG. 3, in the emission spectrum of the semiconductor nanoparticles, band edge emission having a half-width of about 33 nm was observed around 577 nm, the quantum yield of band edge emission was 9%, and the purity of band edge emission components was 79%.

It was confirmed that the semiconductor nanoparticles obtained in Example 1 had a higher quantum yield of band edge emission than those in Comparative Examples 1 and 2.

Example 2

Synthesis of Semiconductor Nanoparticles

Twenty μmol of gallium diethyldithiocarbamate (Ga(DDTC)$_3$), 80 μmol of gallium acetylacetonate (Ga(acac)$_3$) and 7 g of tetradecylamine were weighed, and then, an oleylamine dispersion liquid of the first semiconductor nanoparticles synthesized in the same manner as in Example 1 was added thereto in an amount corresponding to 30 nmol in nanoparticle concentration. The obtained solution was degassed at about 60° C., and the atmosphere was replaced with an argon atmosphere, after which 40 μmol of chloroform as a halogen compound was injected in the solution. The temperature of the solution was rapidly increased until it reached 230° C. (temperature increasing rate: about 60° C./min), at a temperature of 230° C. or higher, the temperature was further increased to 280° C. at a rate of 2° C./min, and the solution was heat-treated at 280° C. for 2 minutes, and then left to cool. Subsequently, a vacuum degassing operation was performed for 1 minute when the temperature was decreased to 120° C., and then Ar was introduced. The solution was further left to cool to 80° C., and hexane and ethanol were added thereto. After the solution was left to cool to room temperature, the solution was subjected to centrifugation to collect only a supernatant solution. Then, methanol was added to the obtained supernatant solution, and centrifugation was performed to obtain a precipitated product of a semiconductor nanoparticles.

Measurement of Absorption Spectrum, Emission Spectrum and Quantum Yield

Figure 4:
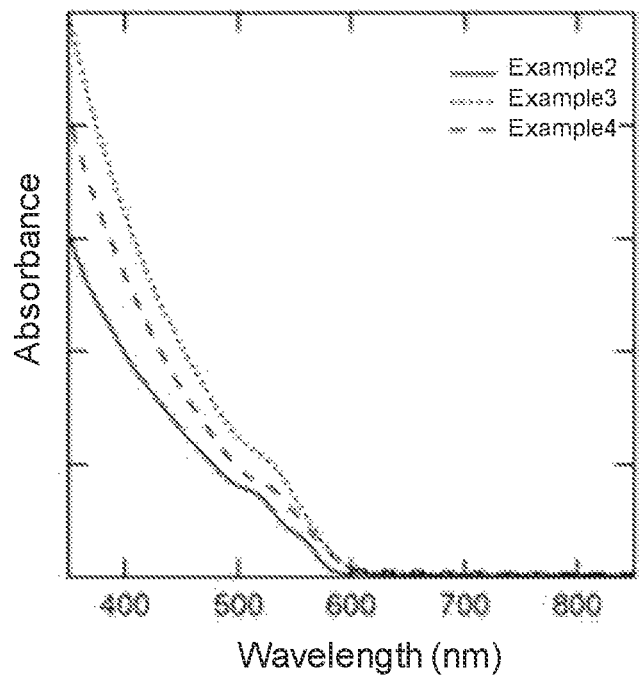
FIG. 4 shows exemplary absorption spectra of semiconductor nanoparticles according to Examples 2 to 4.
Figure 5:
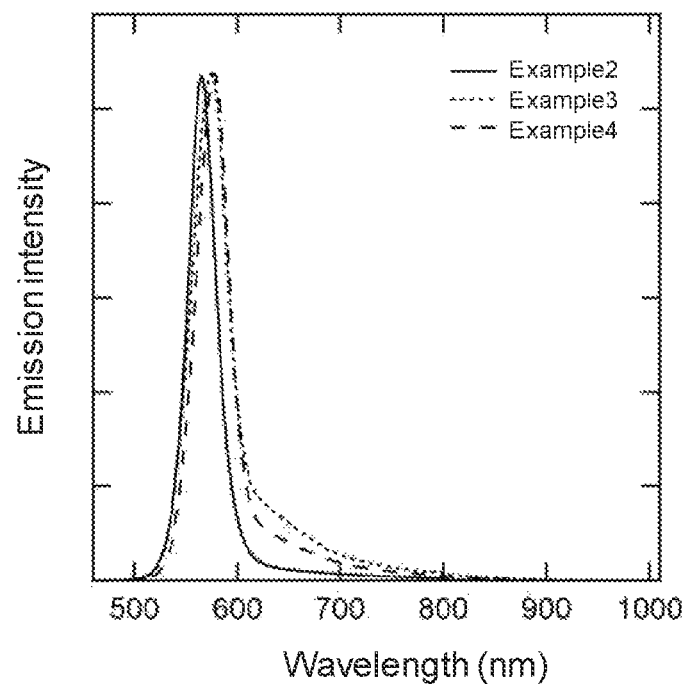
FIG. 5 shows exemplary emission spectra of semiconductor nanoparticles according to Examples 2 to 4.

The absorption spectrum and emission spectrum of the semiconductor nanoparticles were measured in the same manner as in Example 1. The results are shown in Table 1. As shown in FIG. 4, in the absorption spectrum of the semiconductor nanoparticles, a shoulder peak was slightly observed around 500 nm, and it was confirmed that there was almost no absorption at a wavelength of higher than a wavelength around 580 nm. It is therefore presumed that there is an exciton peak around a wavelength of from 400 nm to 580 nm. In addition, as shown in FIG. 5, in the emission spectrum of the semiconductor nanoparticles, band edge emission having a half-width of about 34 nm was observed around 566 nm, the quantum yield of band edge emission was 68%, and the purity of band edge emission components was 100%.

Example 3

Synthesis of Semiconductor Nanoparticles

Twenty μmol of gallium diethyldithiocarbamate (Ga(DDTC)$_3$), 80 μmol of gallium acetylacetonate (Ga(acac)$_3$), 30 μl of an aqueous hydrogen chloride solution (340 μmol as hydrogen chloride) and 7 ml of oleylamine were weighed, and then, an oleylamine dispersion liquid of the first semiconductor nanoparticles synthesized in the same manner as in Example 1 was added thereto in an amount corresponding to 30 nmol in nanoparticle concentration. The obtained solution was degassed at about 100° C., and the atmosphere was replaced with an argon atmosphere. Then, the temperature of the solution was rapidly increased until it reaches 230° C. (temperature increasing rate: about 60° C./min), at a temperature of 230° C. or higher, the temperature was further increased to 260° C. at a rate of 2° C./min, and the solution was heat-treated at 260° C. for 10 minutes, and then left to cool. Subsequently, a vacuum degassing operation was performed for 1 minute when the temperature was decreased to 120° C., and Ar was then introduced, after which the solution was left to cool to room temperature. Then, the solution was subjected to centrifugation to collect only a supernatant solution, methanol was added to the obtained supernatant solution, and this was subjected to centrifugation to obtain a precipitated product of a semiconductor nanoparticles.

Measurement of Absorption Spectrum, Emission Spectrum and Quantum Yield

The absorption spectrum and emission spectrum of the semiconductor nanoparticles were measured in the same manner as in Example 1. The results are shown in Table 1. FIG. 4 shows an absorption spectrum of relative absorbance normalized by the maximum absorbance of the semiconductor nanoparticles of Example 2. FIG. 5 shows an emission spectrum of relative emission intensity normalized by the maximum emission intensity of the semiconductor nanoparticles of Example 2. As shown in FIG. 4, in the absorption spectrum of the semiconductor nanoparticles, a shoulder peak was slightly observed around 500 nm, and it was confirmed that there was almost no absorption at a wavelength of higher than a wavelength around 580 nm. It is therefore presumed that there is an exciton peak around a wavelength of from 400 nm to 580 nm. In addition, as shown in FIG. 5, in the emission spectrum of the semiconductor nanoparticles, band edge emission having a half-width of about 40 nm was observed around 573 nm, the quantum yield of band edge emission was 75%, and the purity of band edge emission components was 69%.

Example 4

Synthesis of Semiconductor Nanoparticles

Twenty μmol of gallium diethyldithiocarbamate (Ga(DDTC)$_3$), 80 μmol of gallium acetylacetonate (Ga(acac)$_3$), 30 μl of an aqueous hydrogen chloride solution (340 μmol as hydrogen chloride) and 7 ml of oleylamine were weighed, and then, an oleylamine dispersion liquid of the first semiconductor nanoparticles synthesized in the same manner as in Example 1 was added thereto in an amount corresponding to 30 nmol in nanoparticle concentration. The obtained solution was degassed at about 100° C., and the atmosphere was replaced with an argon atmosphere. Then, the temperature of the solution was rapidly increased until it reaches 230° C. (temperature increasing rate: about 60° C./min), at a temperature of 230° C. or higher, the temperature was further increased to 280° C. at a rate of 2° C./min, and the solution was heat-treated at 280° C. for 1 minute, and then left to cool. Subsequently, a vacuum degassing operation was performed for 1 minute when the temperature was decreased to 120° C., and Ar was then introduced, after which the solution was left to cool to room temperature. Then, the solution was subjected to centrifugation to collect only a supernatant solution, methanol was added to the obtained supernatant solution, and this was subjected to centrifugation to obtain a precipitated product of a semiconductor nanoparticles.

Measurement of Absorption Spectrum, Emission Spectrum and Quantum Yield

The absorption spectrum and emission spectrum of the semiconductor nanoparticles were measured in the same manner as in Example 1. The results are shown in Table 1. FIG. 4 shows an absorption spectrum of relative absorbance normalized by the maximum absorbance of the semiconductor nanoparticles of Example 2. FIG. 5 shows an emission spectrum of relative emission intensity normalized by the maximum emission intensity of the semiconductor nanoparticles of Example 2. As shown in FIG. 4, in the absorption spectrum of the semiconductor nanoparticles, a shoulder peak was slightly observed around 500 nm, and it was confirmed that there was almost no absorption at a wavelength of higher than a wavelength around 580 nm. It is therefore presumed that there is an exciton peak around a wavelength of from 400 nm to 580 nm. In addition, as shown in FIG. 5, in the emission spectrum of the semiconductor nanoparticles, band edge emission having a half-width of about 37 nm was observed around 576 nm, the quantum yield of band edge emission was 76%, and the purity of band edge emission components was 75%.

Example 5

Synthesis of Semiconductor Nanoparticles

Twenty μmol of gallium diethyldithiocarbamate (Ga(DDTC)$_3$), 80 μmol of gallium acetylacetonate (Ga(acac)$_3$), 30 μl of an aqueous hydrogen bromide solution (260 μmol as hydrogen bromide) and 7 ml of oleylamine were weighed, and then an oleylamine dispersion liquid of the first semiconductor nanoparticles synthesized in the same manner as in Example 1 was added thereto in an amount corresponding to 30 nmol in nanoparticle concentration. The obtained solution was degassed at about 100° C., and the atmosphere was replaced with an argon atmosphere. Then, the temperature of the solution was rapidly increased until it reaches 230° C. (temperature increasing rate: about 60° C./min), at a temperature of 230° C. or higher, the temperature was further increased to 280° C. at a rate of 2° C./min, and the solution was heat-treated at 280° C. for 2 minutes, and then left to cool. Subsequently, a vacuum degassing operation was performed for 1 minute when the temperature was decreased to 120° C., and Ar was then introduced, after which the solution was left to cool to room temperature. Then, the solution was subjected to centrifugation to collect only a supernatant solution, methanol was added to the obtained supernatant solution, and this was subjected to centrifugation to obtain a precipitated product of a semiconductor nanoparticles.

Measurement of Absorption Spectrum, Emission Spectrum and Quantum Yield

Figure 6:
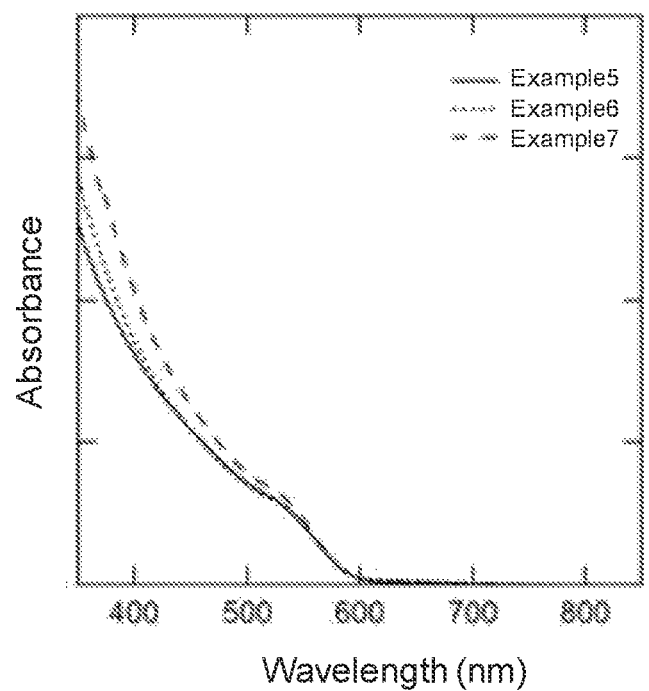
FIG. 6 shows exemplary absorption spectra of semiconductor nanoparticles according to Examples 5 to 7.
Figure 7:
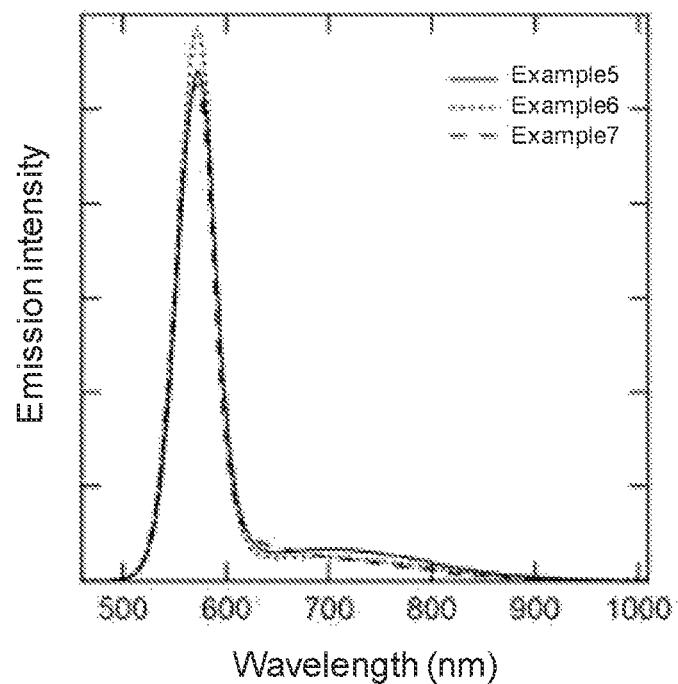
FIG. 7 shows exemplary emission spectra of semiconductor nanoparticles according to Examples 5 to 7.

The absorption spectrum and emission spectrum of the semiconductor nanoparticles were measured in the same manner as in Example 1. The results are shown in Table 1. As shown in FIG. 6, in the absorption spectrum of the semiconductor nanoparticles, a shoulder peak was slightly observed around 500 nm, and it was confirmed that there was almost no absorption at a wavelength of higher than a wavelength around 580 nm. It is therefore presumed that there is an exciton peak around a wavelength of from 400 nm to 580 nm. In addition, as shown in FIG. 7, in the emission spectrum of the semiconductor nanoparticles, band edge emission having a half-width of about 44 nm was observed around 571 nm, the quantum yield of band edge emission was 59%, and the purity of band edge emission components was 73%.

Example 6

Synthesis of Semiconductor Nanoparticles

Twenty μmol of gallium diethyldithiocarbamate (Ga(DTC)$_3$), 80 μmol of gallium acetylacetonate (Ga(acac)$_3$), 60 μl of an aqueous hydrogen bromide solution (520 μmol as hydrogen bromide) and 7 ml of oleylamine were weighed, and then an oleylamine dispersion liquid of the first semiconductor nanoparticles synthesized in the same manner as in Example 1 was added thereto in an amount corresponding to 30 nmol in nanoparticle concentration. The obtained solution was degassed at about 100° C., and the atmosphere was replaced with an argon atmosphere. Then, the temperature of the solution was rapidly increased until it reaches 230° C. (temperature increasing rate: about 60° C./min), at a temperature of 230° C. or higher, the temperature was further increased to 280° C. at a rate of 2° C./min, and the solution was heat-treated at 280° C. for 2 minutes, and then left to cool. Subsequently, a vacuum degassing operation was performed for 1 minute when the temperature was decreased to 120° C., and Ar was then introduced, after which the solution was left to cool to room temperature. Then, the solution was subjected to centrifugation to collect only a supernatant solution, methanol was added to the obtained supernatant solution, and this was subjected to centrifugation to obtain a precipitated product of a semiconductor nanoparticles.

Measurement of Absorption Spectrum, Emission Spectrum and Quantum Yield

The absorption spectrum and emission spectrum of the semiconductor nanoparticles were measured in the same manner as in Example 1. The results are shown in Table 1. FIG. 6 shows an absorption spectrum of relative absorbance normalized by the maximum absorbance of the semiconductor nanoparticles of Example 5. FIG. 7 shows an emission spectrum of relative emission intensity normalized by the maximum emission intensity of the semiconductor nanoparticles of Example 5. As shown in FIG. 6, in the absorption spectrum of the semiconductor nanoparticles, a shoulder peak was slightly observed around 500 nm, and it was confirmed that there was almost no absorption at a wavelength of higher than a wavelength around 580 nm. It is therefore presumed that there is an exciton peak around a wavelength of from 400 nm to 580 nm. In addition, as shown in FIG. 7, in the emission spectrum of the semiconductor nanoparticles, band edge emission having a half-width of about 44 nm was observed around 570 nm, the quantum yield of band edge emission was 64%, and the purity of band edge emission components was 78%.

Example 7

Synthesis of Semiconductor Nanoparticles

Twenty μmol of gallium diethyldithiocarbamate (Ga(DTC)$_3$), 80 μmol of gallium acetylacetonate (Ga(acac)$_3$), 90 μl of an aqueous hydrogen bromide solution (770 μmol as hydrogen bromide) and 7 ml of oleylamine were weighed, and then an oleylamine dispersion liquid of the first semiconductor nanoparticles synthesized in the same manner as in Example 1 was added thereto in an amount corresponding to 30 nmol in nanoparticle concentration. The obtained solution was degassed at about 100° C., and the atmosphere was replaced with an argon atmosphere. Then, the temperature of the solution was rapidly increased until it reaches 230° C. (temperature increasing rate: about 60° C./mini), at a temperature of 230° C. or higher, the temperature was further increased to 280° C. at a rate of 2° C./min, and the solution was heat-treated at 280° C. for 2 minutes, and then left to cool. Subsequently, a vacuum degassing operation was performed for 1 minute when the temperature was decreased to 120° C., and Ar was then introduced, after which the solution was left to cool to room temperature. Then, the solution was subjected to centrifugation to collect only a supernatant solution, methanol was added to the obtained supernatant solution, and this was subjected to centrifugation to obtain a precipitated product of a semiconductor nanoparticles.

Measurement of Absorption Spectrum, Emission Spectrum and Quantum Yield

The absorption spectrum and emission spectrum of the semiconductor nanoparticles were measured in the same manner as in Example 1. The results are shown in Table 1. FIG. 6 shows an absorption spectrum of relative absorbance normalized by the maximum absorbance of the semiconductor nanoparticles of Example 5. FIG. 7 shows an emission spectrum of relative emission intensity normalized by the maximum emission intensity of the semiconductor nanoparticles of Example 5. As shown in FIG. 6, in the absorption spectrum of the semiconductor nanoparticles, a shoulder peak was slightly observed around 500 nm, and it was confirmed that there was almost no absorption at a wavelength of higher than a wavelength around 580 nm. It is therefore presumed that there is an exciton peak around a wavelength of from 400 nm to 580 nm. In addition, as shown in FIG. 7, in the emission spectrum of the semiconductor nanoparticles, band edge emission having a half-width of about 43 nm was observed around 569 nm, the quantum yield of band edge emission was 57%, and the purity of band edge emission components was 77%.

Synthesis of Semiconductor Nanoparticles (Core-Shell Type Semiconductor Nanoparticles)

In the dispersion liquid of the first semiconductor nanoparticles obtained above, $1.0 \times 10^{-5}$ mmol was weighed in terms of the amount of substance (number of particles) as a

TABLE 1

| | Second Step | | | | | Semiconductor nanoparticles | | | |
|---|---|---|---|---|---|---|---|---|---|
| | | | | Halogen compound | | Peak | | Band edge | |
| | | | 1,3-Dimethyl | | Adittion | Heat-treating | emission | Half- | emission | |
| | Ga(DDTC)$_3$ (μmol) | Ga(acac)$_3$ (μmol) | thiourea (μmol) | Type | amount (μmol) | temperature (° C.) | wavelength (nm) | width (nm) | Quantum yield (%) | Purity (%) |
| Example 1 | 20 | 80 | — | — | — | 280 | 572 | 39 | 21 | 53 |
| Comparative Example 1 | — | 100 | 100 | — | — | 280 | 579 | 41 | 15 | 42 |
| Comparative Example 2 | 100 | — | — | — | — | 280 | 577 | 33 | 9 | 79 |
| Example 2 | 20 | 80 | — | Chloroform | 40 | 280 | 566 | 34 | 68 | 100 |
| Example 3 | 20 | 80 | — | Hydrogen chloride | 340 | 260 | 573 | 40 | 75 | 69 |
| Example 4 | 20 | 80 | — | Hydrogen chloride | 340 | 280 | 576 | 37 | 76 | 75 |
| Example 5 | 20 | 80 | — | Hydrogen Bromide | 260 | 280 | 571 | 44 | 59 | 73 |
| Example 6 | 20 | 80 | — | Hydrogen Bromide | 520 | 280 | 570 | 44 | 64 | 78 |
| Example 7 | 20 | 80 | — | Hydrogen Bromide | 770 | 280 | 569 | 43 | 57 | 77 |

It was confirmed that the semiconductor nanoparticles obtained in Examples 2 to 7 had a higher quantum yield of band edge emission than those in Comparative Examples 1 and 2. In addition, since the quantum yields of band edge emission of the semiconductor nanoparticles of Examples 2 to 7 were higher than that in Example 1, it was confirmed that the quantum yield of band edge emission was increased by using a halogen compound during synthesis of the semiconductor nanoparticles.

Example 8

Synthesis of First Semiconductor Nanoparticles

Into a mixed liquid of 0.25 mL of 1-dodecanethiol and 2.75 mL of oleylamine, 0.1402 mmol of silver acetate (AgOAc), 0.06 mmol of sodium acetate (NaOAc), 0.06 mmol of indium acetate (In(OAc)$_3$), 0.24 mmol of gallium acetylacetonate (Ga(acac)$_3$) and 0.55 mmol of a sulfur simple substance as a sulfur source were charged and dispersed. The dispersion liquid was placed in a test tube together with a stirring bar, and the inside of the test tube was replaced with nitrogen. Then, a first stage heat treatment at 150° C. for 10 minutes and a second stage heat treatment at 300° C. for 10 minutes were performed under a nitrogen atmosphere while the contents of the test tube were stirred. After the heat treatment, the obtained suspension liquid was left to cool and then subjected to centrifugation (radius 146 mm, 4,000 rpm, 5 min). The obtained supernatant was filtered through a membrane filter (pore size: 0.2 μm) to take out a dispersion liquid. Subsequently, methanol was added to the dispersion liquid, the mixture was subjected to centrifugation (radius: 146 mm, 4,000 rpm, 5 min), ethanol was added to the obtained precipitate, and the mixture was subjected to centrifugation (radius: 146 mm, 4,000 rpm, 5 min) to precipitate first semiconductor nanoparticles. The precipitated product was dispersed in chloroform to obtain a dispersion liquid of the first semiconductor nanoparticles.

nanoparticle, the solvent was evaporated in a test tube, and then the resulting particles were dispersed in 3 mL of oleylamine. Then, when this oleylamine dispersion liquid was heated to 300° C. under a nitrogen atmosphere, 6 mL of an oleylamine solution containing $8 \times 10^{-5}$ mol of gallium diethyldithiocarbamate (Ga(DDTC)$_3$) and $8 \times 10^{-5}$ mol of gallium chloride (GaCl$_3$) was added dropwise to the dispersion liquid at a rate of 3 mL/hour, and the mixture was further heated at 300° C. for 30 minutes. The mixture was taken out from a heating source, left to cool to normal temperature, subjected to centrifugation (radius: 150 mm, 4,000 rpm, 5 min), and separated into a supernatant portion and a precipitate portion. Thereafter, methanol was added to each of the separated supernatant liquid and precipitate portion, and each mixture was subjected to centrifugation (radius: 146 mm, 4,000 rpm, 5 min). Then, ethanol was added to the obtained precipitate, followed by centrifugation (radius 146 mm, 4,000 rpm, 5 min) to precipitate semiconductor nanoparticles. The precipitated product was dispersed in chloroform to obtain a dispersion liquid of a semiconductor nanoparticles. The average particle size of the semiconductor nanoparticles taken out from the supernatant was measured and found to be 5 nm. The thickness of the shell as determined from the difference from the average particle size of the first semiconductor nanoparticles was about 0.5 nm on average. The average particle size of the semiconductor nanoparticles taken out from the precipitate was measured and found to be 7.1 nm. The thickness of the shell as determined from the difference from the average particle size of the first semiconductor nanoparticles serving as a core was about 1.55 nm on average.

Measurement of Absorption Spectrum, Emission Spectrum and Quantum Yield

Figure 8:
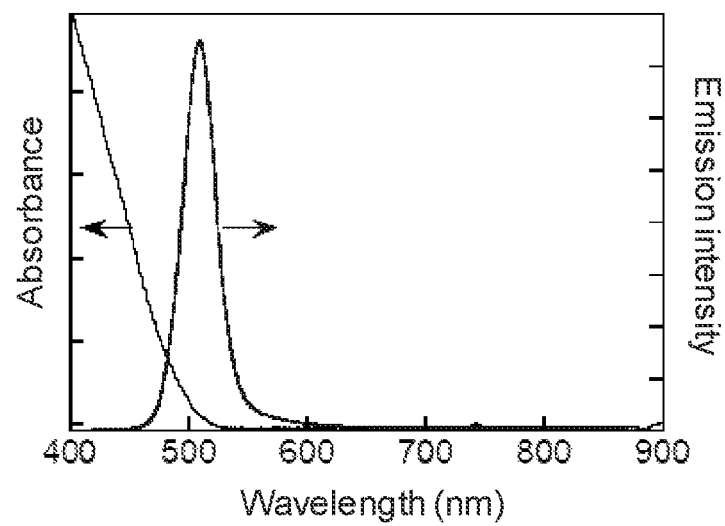
FIG. 8 shows an exemplary absorption spectrum and an exemplary emission spectrum of semiconductor nanoparticles according to Example 8.
Figure 9:
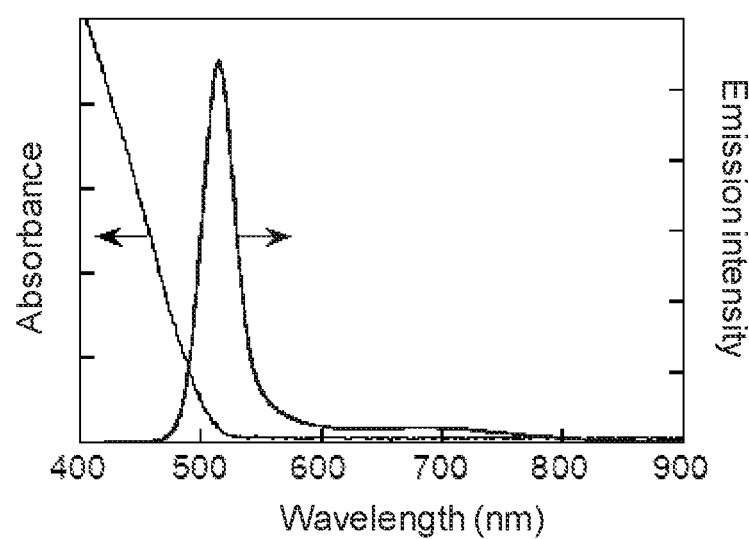
FIG. 9 shows an exemplary absorption spectrum and an exemplary emission spectrum of semiconductor nanoparticles according to Example 8.

The absorption spectrum and emission spectrum were measured for the obtained semiconductor nanoparticles. The absorption spectrum was measured at a wavelength of 190 nm or more and 1,100 nm or less using a diode array spectrophotometer (trade name: Agilent 8453A, manufactured by Agilent Technologies). The emission spectrum was measured at an excitation wavelength of 365 nm using a multichannel spectrometer (trade name: PMA11, manufactured by Hamamatsu Photonics K.K.). The emission spectrum and the absorption spectrum of the semiconductor nanoparticles collected from the supernatant of Example 8 are shown in FIG. 8. The emission spectrum and the absorption spectrum of the semiconductor nanoparticles collected from the precipitate are shown in FIG. 9.

TABLE 2

|  |  | Peak emission wavelenth (nm) | Half-width (nm) | Band edge emission | |
|---|---|---|---|---|---|
|  |  |  |  | Quatum yield (%) | Purity (%) |
| Example 8 | Supernatant | 511 | 32 | 61 | 100 |
|  | Precipitate | 517 | 32 | 29 | 82 |

It was confirmed that the semiconductor nanoparticles obtained in Example 8 had a higher quantum yield of band edge emission than those in Comparative Examples 1 and 2.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

Although the present disclosure has been described with reference to several exemplary embodiments, it is to be understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular examples, means, and embodiments, the disclosure may be not intended to be limited to the particulars disclosed; rather the disclosure extends to all functionally equivalent structures, methods, and uses such as are within the scope of the appended claims.

One or more examples or embodiments of the disclosure may be referred to herein, individually and/or collectively, by the term "disclosure" merely for convenience and without intending to voluntarily limit the scope of this application to any particular disclosure or inventive concept. Moreover, although specific examples and embodiments have been illustrated and described herein, it should be appreciated that any subsequent arrangement designed to achieve the same or similar purpose may be substituted for the specific examples or embodiments shown. This disclosure may be intended to cover any and all subsequent adaptations or variations of various examples and embodiments. Combinations of the above examples and embodiments, and other examples and embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure may be not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

All publications, patent applications, and technical standards mentioned in this specification are herein incorporated by reference to the same extent as if each individual publication, patent application, or technical standard was specifically and individually indicated to be incorporated by reference.

What is claimed is:

1. A method for producing semiconductor nanoparticles, comprising:

providing first semiconductor nanoparticles containing a semiconductor containing an element $M^1$ being at least one element selected from the group consisting of Ag, Cu, Au and an alkali metal, and containing at least Ag, an element $M^2$ being at least one element selected from the group consisting of Al, Ga, In and Tl, and containing at least one of In or Ga, and an element Z containing at least one element selected from the group consisting of S, Se and Te; and heat-treating a mixture containing the first semiconductor nanoparticles, a first compound having a Ga—S bond and being a Ga salt of a sulfur-containing compound selected from the group consisting of thiocarbamic acid, dithiocarbamic acid, thiocarbonate, dithiocarbonate (xanthogenic acid), trithiocarbonate, thiocarboxylic acid, dithiocarboxylic acid and derivatives thereof, a second compound containing Ga and not containing S, and an organic solvent to obtain second semiconductor nanoparticles.

2. The production method according to claim 1, wherein in the first semiconductor nanoparticles, a total content of the element $M^1$ in a composition of the first semiconductor nanoparticles is 10% by mol or more and 30% by mol or less, a total content of the element $M^2$ is 15% by mol or more and 35% by mol or less, and a total content of the element Z is 35% by mol or more and 55% by mol or less.

3. The production method according to claim 1, wherein the heat-treating is performed at a temperature of 200° C. or higher.

4. The production method according to claim 1, wherein in the mixture, a molar content ratio of the second compound based on Ga with respect to a number of moles of the first compound is 1 or more and 10 or less.

5. The production method according to claim 1, further comprising adding a halogen compound to the mixture in the heat-treating.

6. The production method according to claim 1, wherein the mixture further contains a halogen compound.

* * * * *